US012581704B2

(12) United States Patent
Pan et al.

(10) Patent No.: US 12,581,704 B2
(45) Date of Patent: Mar. 17, 2026

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Kuan-Ting Pan, Taipei City (TW); Che-Lun Chang, Hsinchu (TW); Kuo-Cheng Chiang, Zhubei City (TW); Chih-Hao Wang, Baoshan Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 455 days.

(21) Appl. No.: 18/164,399

(22) Filed: Feb. 3, 2023

(65) Prior Publication Data

US 2024/0266396 A1 Aug. 8, 2024

(51) Int. Cl.
| | |
|---|---|
| *H10D 62/10* | (2025.01) |
| *H10D 30/67* | (2025.01) |
| *H10D 62/13* | (2025.01) |
| *H10D 64/01* | (2025.01) |
| *H10D 84/01* | (2025.01) |
| *H10D 84/03* | (2025.01) |

(52) U.S. Cl.
CPC ....... *H10D 62/121* (2025.01); *H10D 30/6735* (2025.01); *H10D 30/6757* (2025.01); *H10D 62/151* (2025.01); *H10D 64/017* (2025.01); *H10D 64/018* (2025.01); *H10D 84/0128*

(2025.01); *H10D 84/013* (2025.01); *H10D 84/0151* (2025.01); *H10D 84/038* (2025.01)

(58) Field of Classification Search
CPC ............. H10D 62/121; H10D 84/0151; H10D 30/6757; H10D 84/013; H10D 64/018; H10D 64/017; H10D 62/151; H10D 30/6735; H10D 84/0128; H10D 84/038
See application file for complete search history.

(56) References Cited

U.S. PATENT DOCUMENTS

| | | | |
|---|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |

(Continued)

*Primary Examiner* — Richard A Booth
(74) *Attorney, Agent, or Firm* — Birch, Stewart, Kolasch & Birch, LLP

(57) ABSTRACT

A semiconductor structure and a method for forming the same are provided. The semiconductor device structure includes a substrate having a first region and a second region, and a plurality of first nanostructures stacked in a vertical direction in the first region. The semiconductor device structure includes a plurality of second nanostructures stacked in the vertical direction in the second region, and a silicon germanium (SiGe) layer formed below the first nanostructures in the first region. The semiconductor device structure also includes a first gate structure surrounding the first nanostructures in the first region, and a second gate structure surrounding the second nanostructures in the second region. The bottommost surface of the second gate structure is lower than the bottommost surface of the first gate structure.

20 Claims, 33 Drawing Sheets

(56)  References Cited

U.S. PATENT DOCUMENTS

| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2020/0227570 | A1* | 7/2020 | Chen | B82Y 10/00 |
| 2021/0202731 | A1* | 7/2021 | Chiang | H10D 62/116 |
| 2021/0376076 | A1* | 12/2021 | Su | H10D 30/014 |

* cited by examiner

100a 108
106
108
106
108B
106B

102

X ← → Y

100a

104b

104a 108
106
108
106
108B
106B
112
102

X          Y

176

104a

104b 152
108
108B
106B
138a/b
112
102

172
170
148a/b

112

X
Y

10/20

136a/b 104a    104b 176
138a/b 108
152
108B
106B
112
102

Y

10/20

100d 104a      179      104b

181

108"

108B'
106B 176
138a 112
102

10

Y

100d 190a      190b 186a      186b
184      184
182      182
108"      108"
108"      108"
108B'
176      106B
138a 112
102

10

Y

SEMICONDUCTOR DEVICE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs.

Although existing semiconductor devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 4A-2-4G-2 show cross-sectional representations of various stages of forming the semiconductor device structure along line Y-Y' shown in FIG. 4A-1, in accordance with some embodiments of the disclosure.

FIGS. 5A-1-5D-1 show perspective views of various stages of forming the semiconductor device structure after the structure of FIGS. 4G-1 and 4G-2, in accordance with some embodiments of the disclosure.

FIG. 5A-2-5D-2 show cross-sectional representations of various stages of forming the semiconductor device structure along line Y-Y' shown in FIG. 5A-1, in accordance with some embodiments of the disclosure.

FIGS. 6A-1-6D-1 show perspective views of various stages of forming the semiconductor device structure after the structure of FIGS. 4G-1 and 4G-2 in the second region 20, in accordance with some embodiments of the disclosure.

FIGS. 6A-2-6D-2 show cross-sectional representations of various stages of forming the semiconductor device structure along line Y-Y' shown in FIG. 6A-1, in accordance with some embodiments of the disclosure. .

DETAILED DESCRIPTION

Figure 1A:
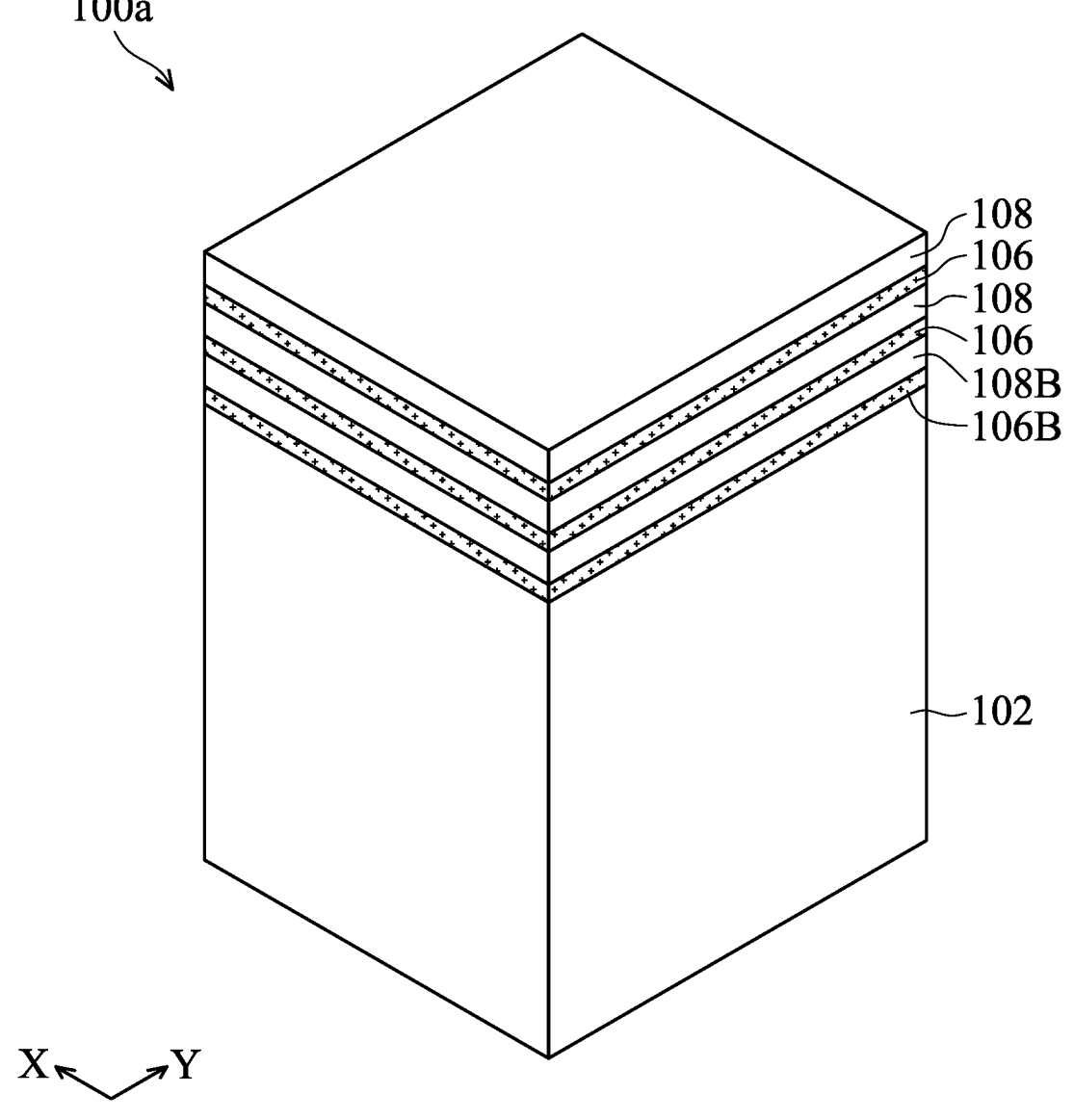
FIGS. 1A to 1E illustrate perspective views of intermediate stages of manufacturing a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments for forming a semiconductor device structure are provided. The semiconductor device structure may include the bottommost first semiconductor layer formed over a substrate, and nanostructures formed over the bottommost first semiconductor layer and a gate structure wraps around the nanostructures. The dummy layer is formed adjacent to the nanostructure, and the S/D structure is formed over the dummy layer. The effective (or active) nanostructures is controlled by designed the locations of the dummy layer and the bottommost first semiconductor layer.

The multi-nanostructures co-exist by controlling the locations of the dummy layer, and the location of the dummy layer is controlled by the location of the bottommost first semiconductor layer. More effective (or active) nanostructures can improve the speed of the semiconductor device structure, and fewer effective (or active) nanostructures can increase the power efficiency. Therefore, the semiconductor device structure can include more effective (or active) nanostructures in a region for speed performance consideration and fewer effective (or active) nanostructures in another region for power efficiency consideration. Accordingly, the performance of semiconductor device structure is improved.

FIGS. 1A to 1E illustrate perspective views of intermediate stages of manufacturing a semiconductor device structure 100a, in accordance with some embodiments.

The semiconductor device structure 100a may include multi-gate devices and may be included in a microprocessor, a memory, or other IC devices. For example, the semiconductor device structure 100a may be a portion of an IC chip that include various diodes, passive and active microelectronic devices such as resistors, capacitors, inductors, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other applicable components, or combinations thereof.

As shown in FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A number of first semiconductor layers 106 and a number of second semiconductor layers 108 are sequentially alternately formed over the substrate 102 along the first direction (e.g. X-axis). The first semiconductor layers 106 and the second semiconductor layers 108 are vertically stacked to form a stacked nanostructures structure (or a stacked nanosheet or a stacked nanowire). The bottommost first semiconductor layer 106B is below and in direct contact with the bottommost second semiconductor 108B.

In some embodiments, the first semiconductor layers 106 and the second semiconductor layers 108 independently include silicon (Si), germanium (Ge), silicon germanium ($Si_{1-x}Gex$, 0.1<x<0.7, the value x is the atomic percentage of germanium (Ge) in the silicon germanium), indium arsenide (InAs), indium gallium arsenide (InGaAs), indium antimonide (InSb), or another applicable material. In some embodiments, the first semiconductor layer 106 and the second semiconductor layer 108 are made of different materials.

The first semiconductor layers 106 and the second semiconductor layers 108 are made of different materials having different lattice constant. In some embodiments, the first semiconductor layer 106 is made of silicon germanium ($Si_{1-x}Gex$), and the second semiconductor layer 108 is made of silicon (Si). In some other embodiments, the first semiconductor layer 106 is made of silicon (Si), and the second semiconductor layer 108 is made of silicon germanium ($Si_{1-x}Gex$).

In some embodiments, the first semiconductor layer 106 is made of silicon germanium ($Si_{1-x}Gex$), and the germanium (Ge) % of the bottommost first semiconductor layer 106B is lower than about 5% to about 10% of the germanium (Ge) % of the other first semiconductor layers 106 above the bottommost first semiconductor layer 106B. In some embodiments, the bottommost first semiconductor layer 106B has germanium (Ge) % in a range from about 15% to about 35%. In some embodiments, each of the other first semiconductor layers 106 over the bottommost first semiconductor layer 106B has germanium (Ge) % in a range from about 25% to about 45%. In some embodiments, the bottommost first semiconductor layer 106B has a thickness along the vertical direction (e.g. Z-axis) is in a range from about 5 nm to about 15 nm.

In some embodiments, the first semiconductor layers 106 and the second semiconductor layers 108 are formed by a selective epitaxial growth (SEG) process, a chemical vapor deposition (CVD) process (e.g. low-pressure CVD (LPCVD), plasma enhanced CVD (PECVD)), a molecular epitaxy process, or another applicable process. In some embodiments, the first semiconductor layers 106 and the second semiconductor layers 108 are formed in-situ in the same chamber.

In some embodiments, the thickness of each of the first semiconductor layers 106 is in a range from about 1.5 nanometers (nm) to about 20 nm. Terms such as "about" in conjunction with a specific distance or size are to be interpreted as not to exclude insignificant deviation from the specified distance or size and may include for example deviations of up to 20%. In some embodiments, the first semiconductor layers 106 are substantially uniform in thickness. In some embodiments, the thickness of each of the second semiconductor layers 108 is in a range from about 1.5 nm to about 20 nm. In some embodiments, the second semiconductor layers 108 are substantially uniform in thickness.

Figure 1B:
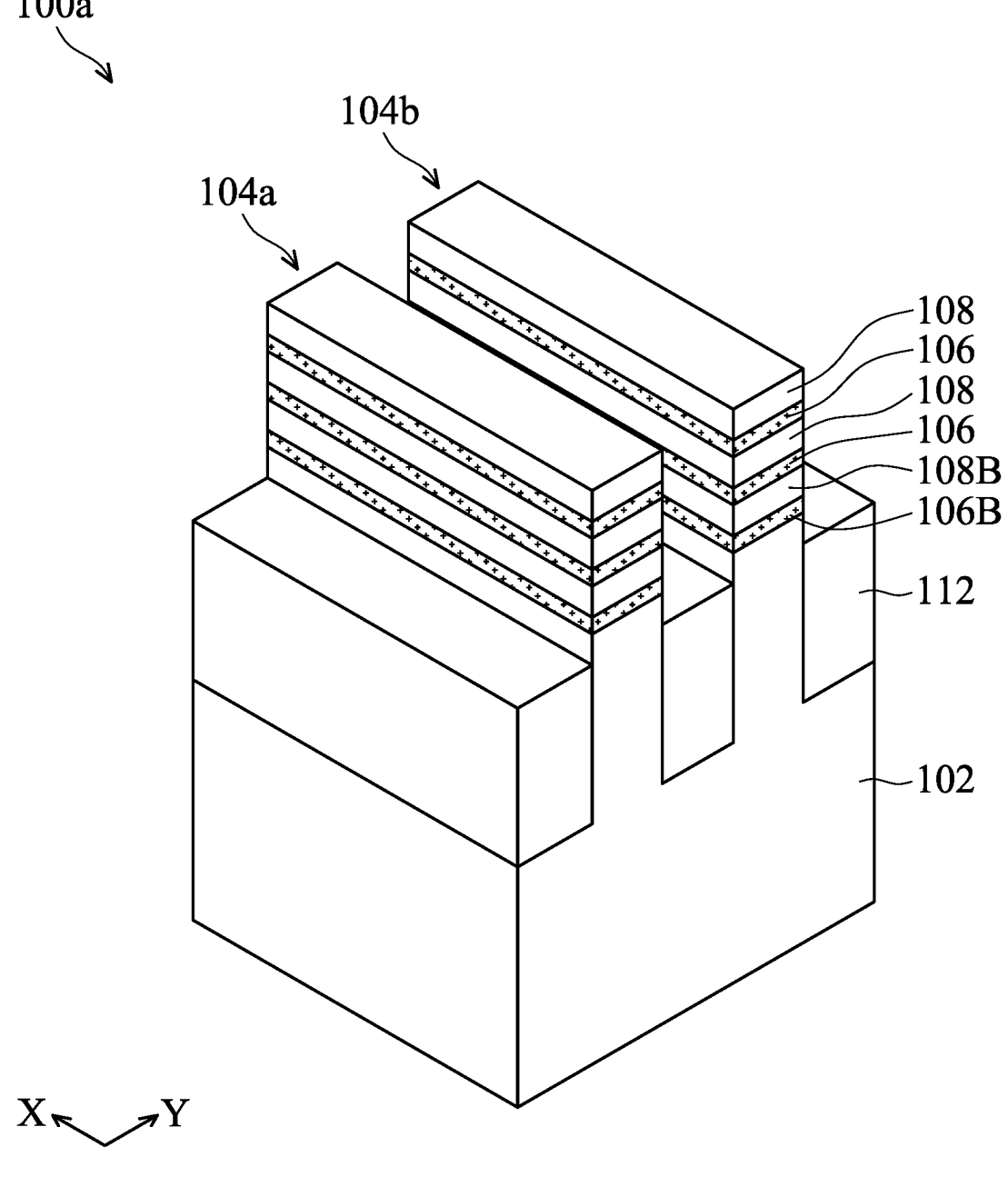

Then, as shown in FIG. 1B, the first semiconductor layers 106 and the second semiconductor layers 108 are patterned to form the first stack structure 104a and the second stack structure 104b, in accordance with some embodiments of the disclosure. In some embodiments, the first stack structure 104a and the second stack structure 104b include base fin structures and the semiconductor material stacks, including the first semiconductor layers 106 and the second semiconductor layers 108, formed over the base fin structure 105.

In some embodiments, the patterning process includes forming mask structures over the semiconductor material stack, and etching the semiconductor material stack and the underlying substrate 102 through the mask structure. In some embodiments, the mask structures are a multilayer structure including a pad oxide layer and a nitride layer formed over the pad oxide layer. The pad oxide layer may be made of silicon oxide, which may be formed by thermal oxidation or CVD, and the nitride layer may be made of silicon nitride, which may be formed by CVD, such as LPCVD or plasma-enhanced CVD (PECVD).

Next, an isolation structure 112 is formed to surround the first stack structure 104a and the second stack structure 104b, in accordance with some embodiments. The isolation structure 112 is configured to electrically isolate active regions (e.g. the first stack structure 104a and the second stack structure 104b) of the semiconductor device structure and is also referred to as shallow trench isolation (STI) feature in accordance with some embodiments.

Figure 1C:
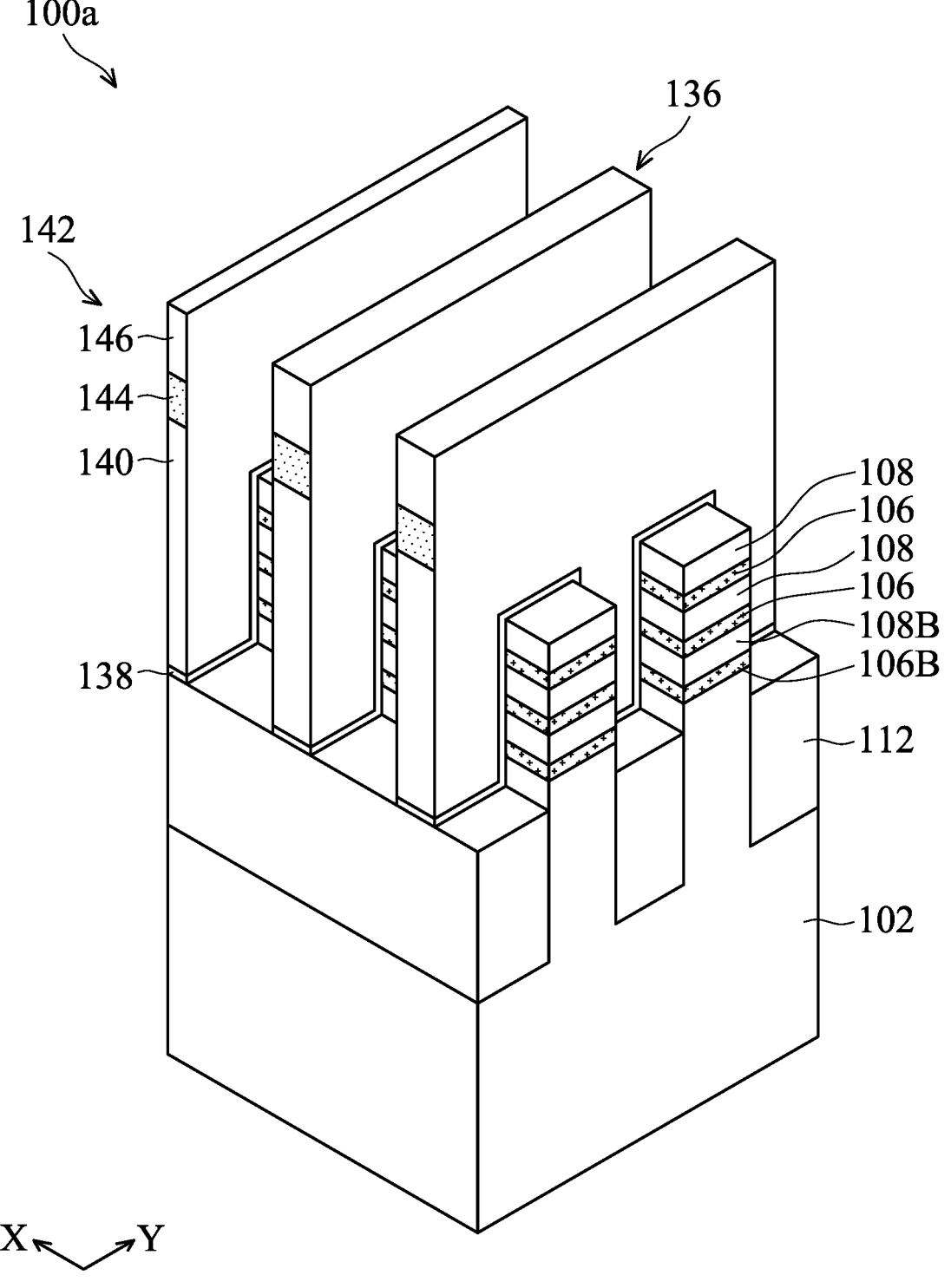

Afterwards, as shown in FIG. 1C, after the isolation structure 112 is formed, dummy gate structures 136 are formed across the fin structure 104, in accordance with some embodiments. The dummy gate structures 136 is formed along the second direction (e.g. Y-axis).

The dummy gate structures 136 may be used to define the source/drain (S/D) regions and the channel regions of the resulting semiconductor device structure 100a. In some embodiments, the dummy gate structures 136 include a dummy gate dielectric layer 138 and a dummy gate electrode layer 140. The source/drain (S/D) region(s) may refer to a source or a drain, individually or collectively dependent upon the context.

In some embodiments, the dummy gate dielectric layer 138 is made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layer 138 is formed using thermal oxidation, CVD, ALD, physical vapor deposition (PVD), another suitable method, or a combination thereof.

In some embodiments, the dummy gate electrode layer 140 is made of conductive material includes polycrystalline-silicon (poly-Si), poly-crystalline silicon-germanium (poly-SiGe), or a combination thereof. In some embodiments, the dummy gate electrode layer 140 is formed using CVD, PVD, or a combination thereof.

The formation of the dummy gate structures 136 may include conformally forming a dielectric material as the dummy gate dielectric layers 138. Afterwards, a conductive material may be formed over the dielectric material as the dummy gate electrode layers 140, and a hard mask layer 142 may be formed over the conductive material. Next, the dielectric material and the conductive material may be patterned through the hard mask layer 142 to form the dummy gate structures 136. In some embodiments, the hard mask layers 142 include multiple layers, such as an oxide layer 144 and a nitride layer 146. In some embodiments, the oxide layer 144 is silicon oxide, and the nitride layer 146 is silicon nitride.

Figure 1D:
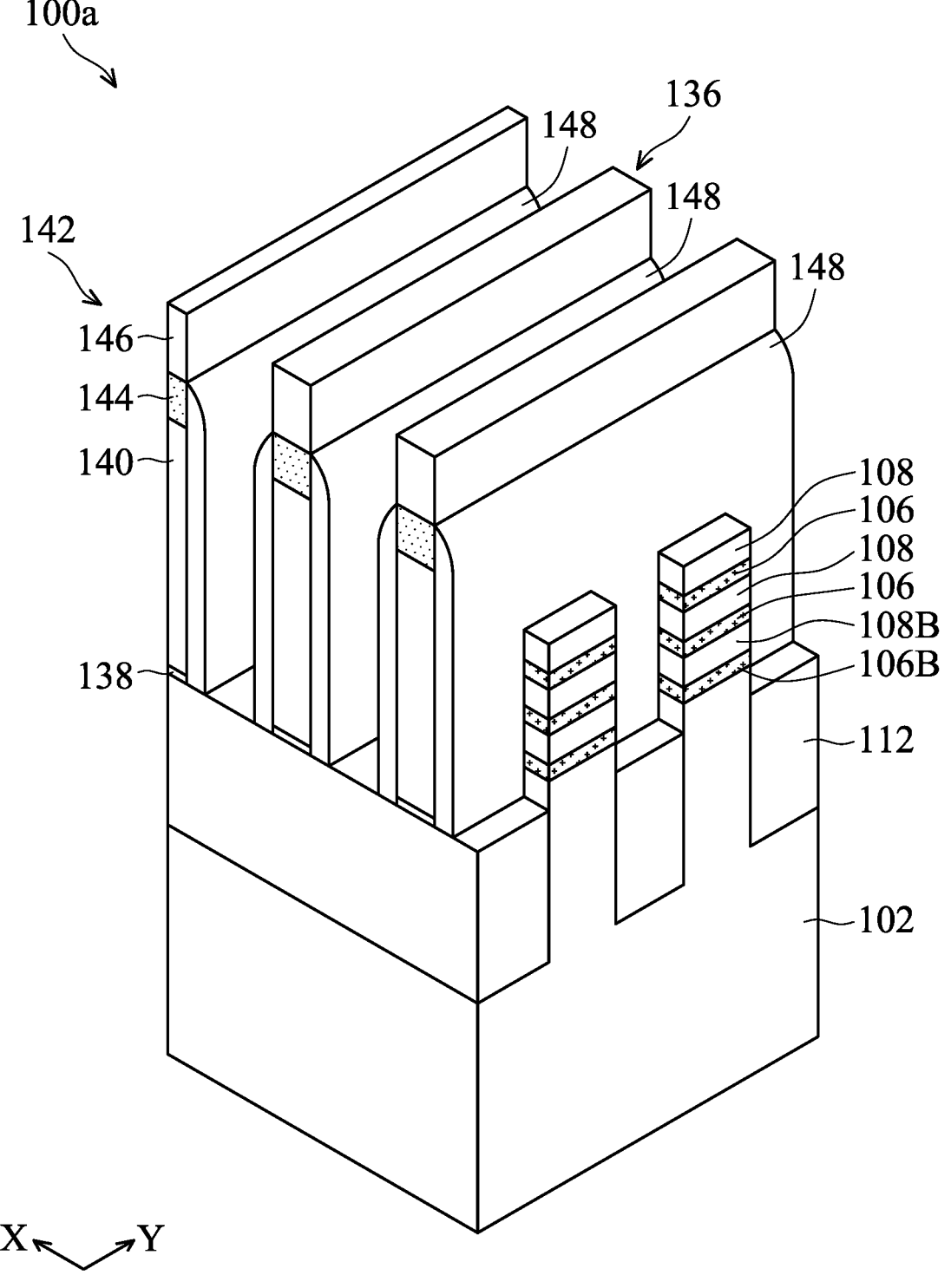

Next, as shown in FIG. 1D, after the dummy gate structures 136 are formed, gate spacers 148 are formed along and covering opposite sidewalls of the dummy gate structures 136, in accordance with some embodiments.

The gate spacers 148 may be configured to separate source/drain structures (formed afterwards) from the dummy gate structures 116. In some embodiments, the gate spacers 148 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof.

Figure 1E:
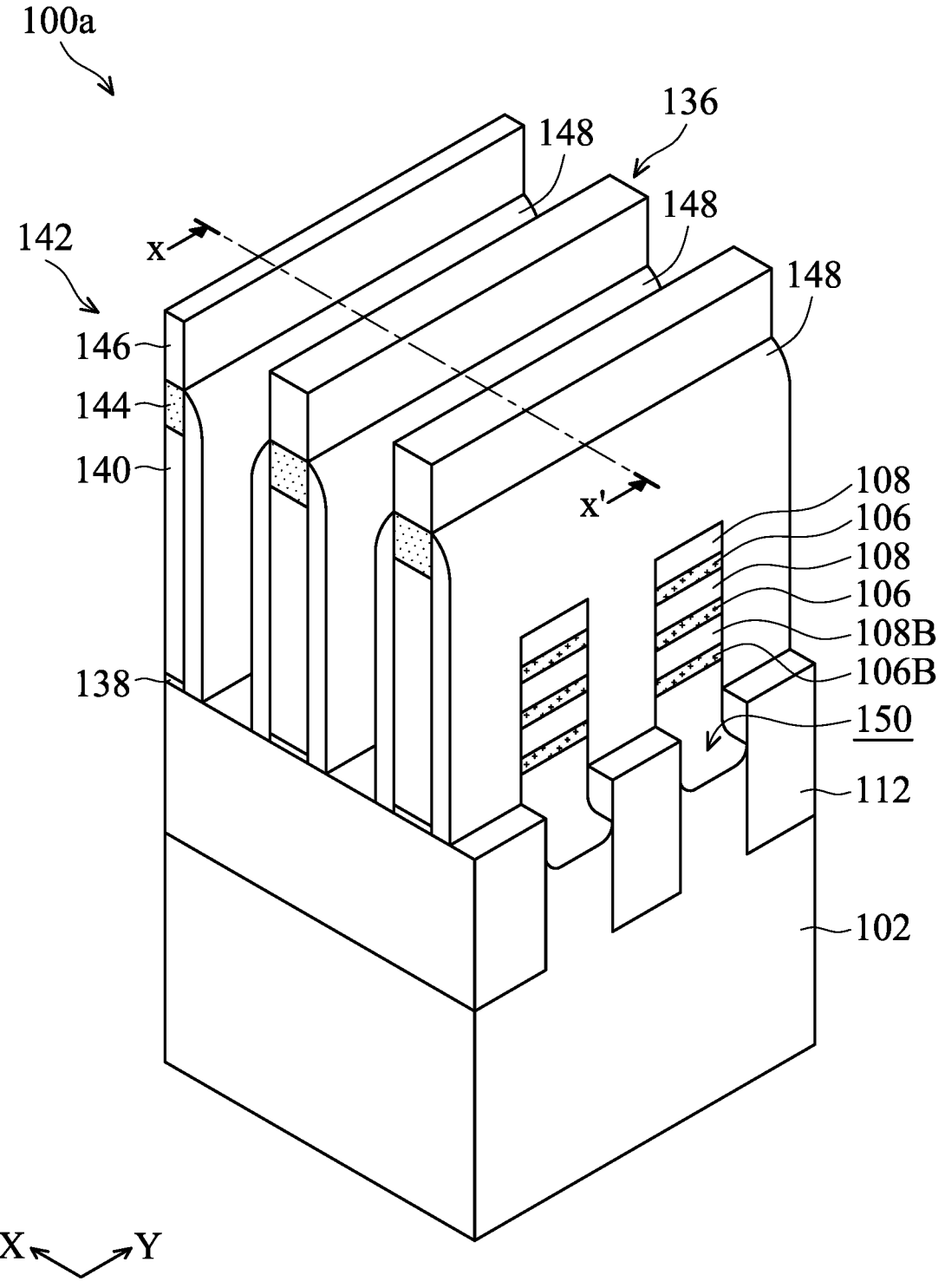

Next, as shown in FIG. 1E, after the gate spacers 148 are formed, source/drain (S/D) trenches 150 are formed adjacent to the gate spacers 148, in accordance with some embodiments. More specifically, the first stack structure 104a and the second stack structure 104b not covered by the dummy gate structures 136 and the gate spacers 148 are recessed, in accordance with some embodiments.

In some embodiments, the first stack structure 104a and the second stack structure 104b are recessed by performing an etching process. The etching process may be an anisotropic etching process, such as dry plasma etching, and the dummy gate structure 136 and the gate spacers 148 may be used as etching masks during the etching process.

FIGS. 2A-2L show cross-sectional representations of various stages of forming the semiconductor device structure 100a along line X-X' shown in FIG. 1E, in accordance with some embodiments of the disclosure.

Figure 2A:
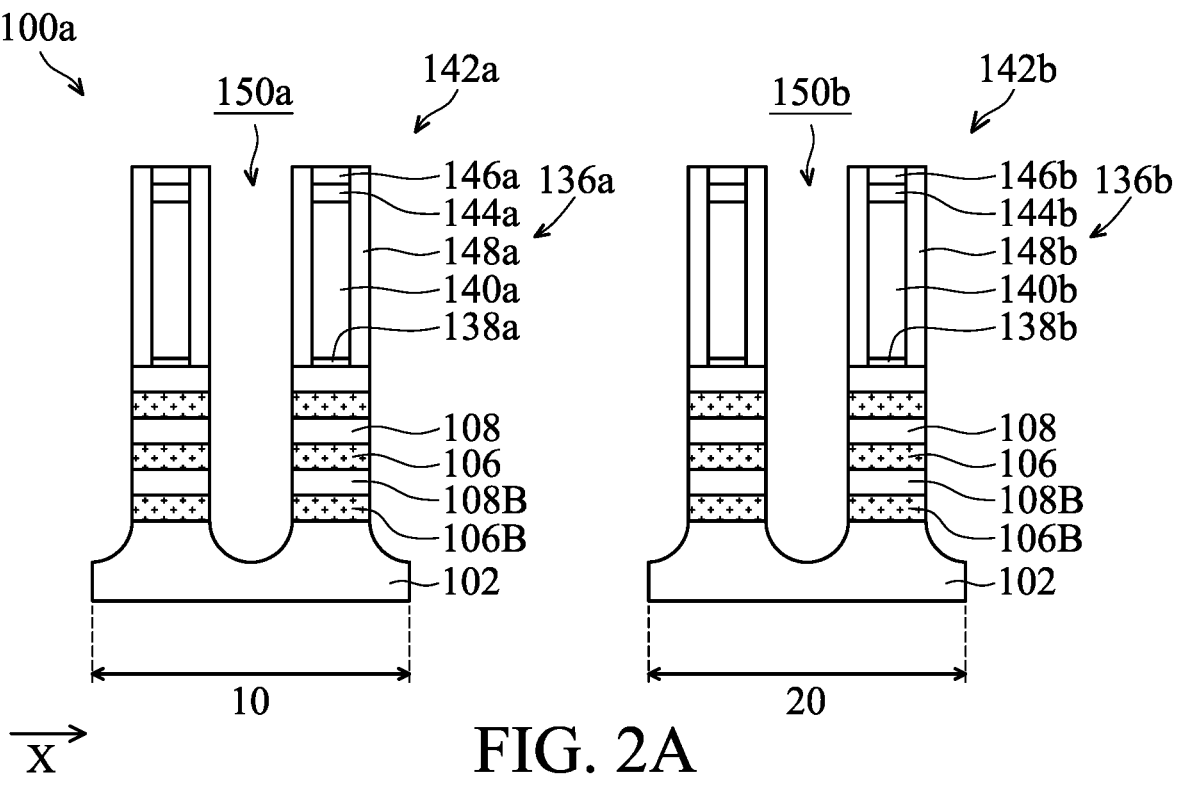
FIGS. 2A-2L show cross-sectional representations of various stages of forming the semiconductor device structure along line X-X' shown in FIG. 1F, in accordance with some embodiments of the disclosure.

As shown in FIG. 2A, the substrate 102 has a first region 10 and a second region 20. The first S/D trench 150a is formed in the first region 10, and the second S/D trench 150b is formed in the second region 20.

Figure 2B:
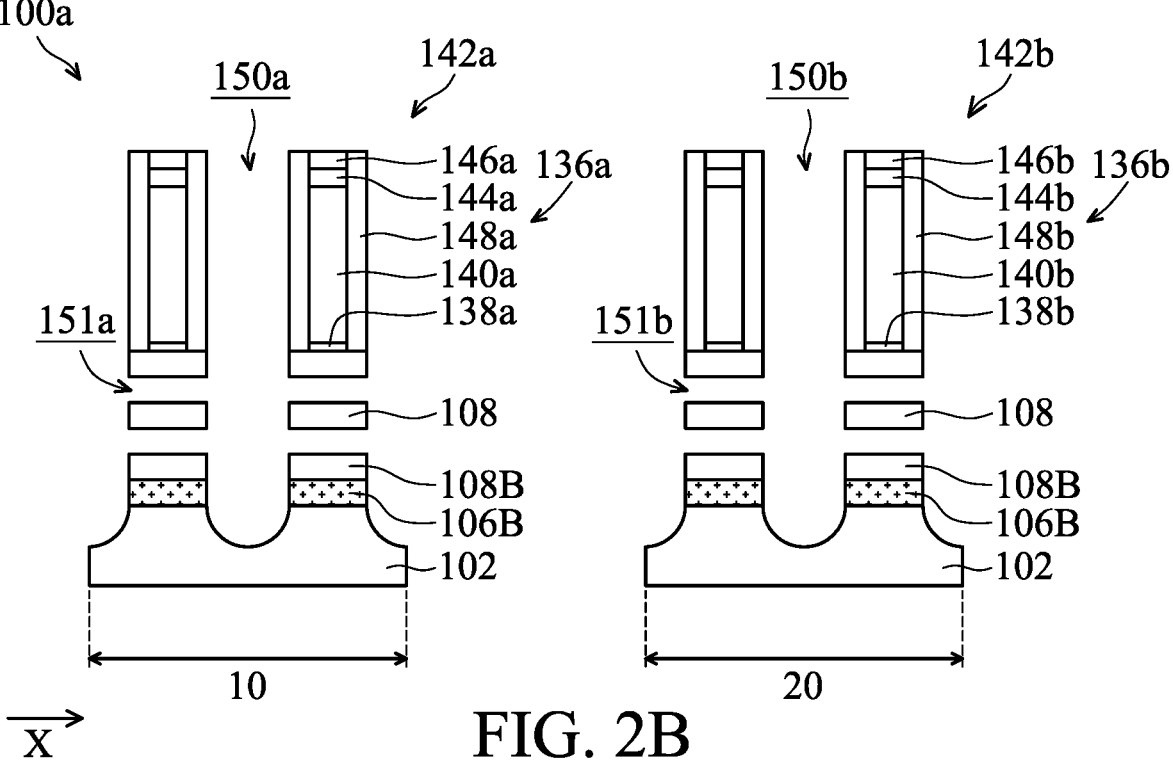

Next, as shown in FIG. 2B, a portion of the first semiconductor layers 106 is removed through the first S/D trench 150a in the first region 10, and portion of the first semiconductor layers 106 is removed through the second S/D trench 150b in the second region 20, in accordance with some embodiments of the disclosure. As a result, a first recess 151a in the first region 10 and a second recess 151b in the second region 20 are formed. In some embodiments, the portion of the first semiconductor layers 106 is removed by an etching process, such as a wet etching process or a dry etching process.

Since the germanium (Ge) % of the bottommost first semiconductor layer 106B is lower than the germanium (Ge) % of the other first semiconductor layers 106 above the bottommost first semiconductor layer 106B, the bottommost first semiconductor layer 106B is not removed by the etching process while the other first semiconductor layers 106 above the bottommost first semiconductor layer 106B are removed. It should be noted that the bottommost first semiconductor layer 106B and the bottommost second semiconductor layer 108B are remaining. The first recess 151 and the second recess 151b are above the bottommost first semiconductor layer 106B and the bottommost second semiconductor layer 108B.

Figure 2C:
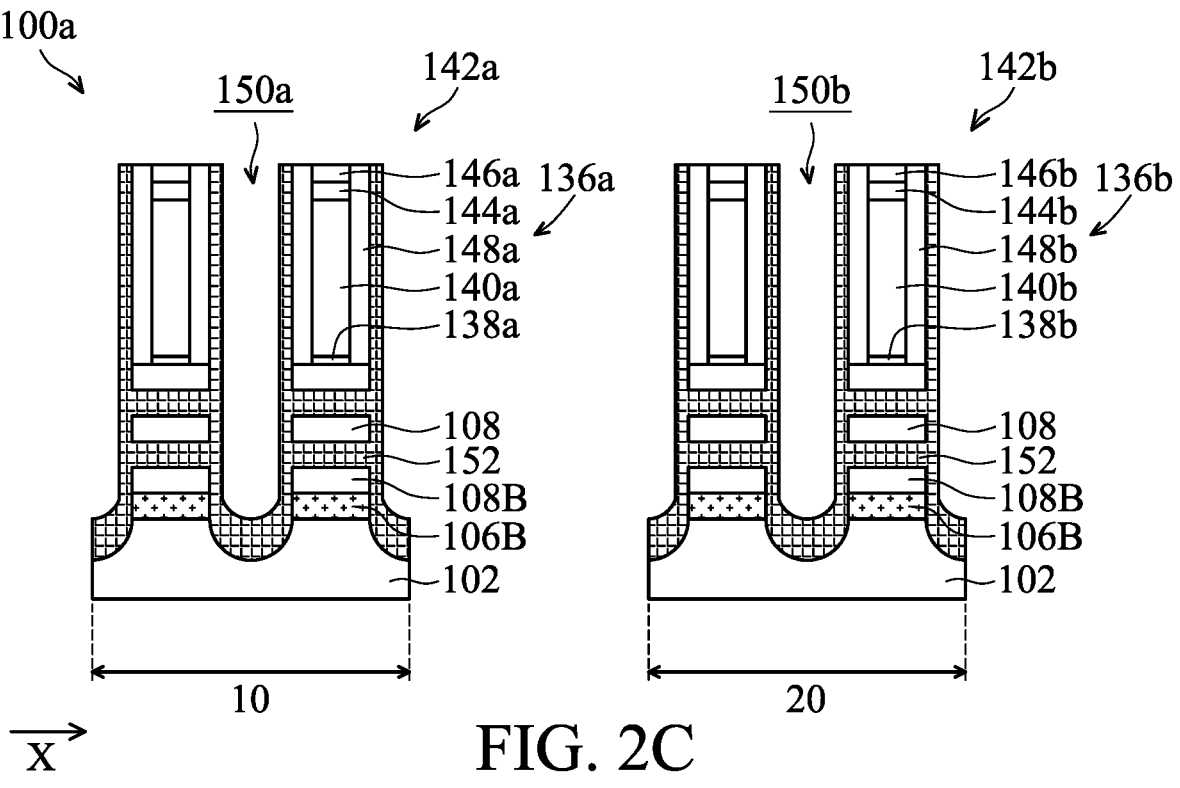

Afterwards, as shown in FIG. 2C, a sacrificial layer 152 is formed in the first recess 133a and the second recess 133b, in accordance with some embodiments of the disclosure.

In some embodiments, the sacrificial layer 152 is made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof.

Figure 2D:
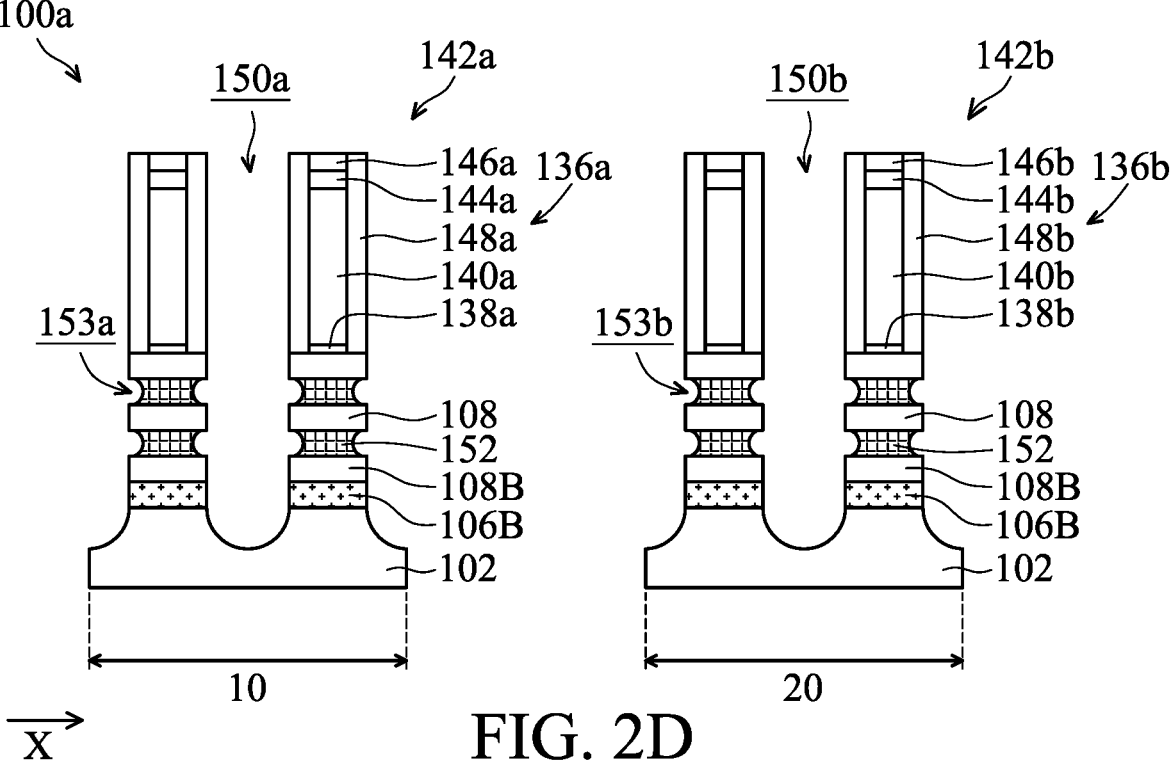

Next, as shown in FIG. 2D, a portion of the sacrificial layer 152 is removed to form a first notch 153a and a second notch 153b, in accordance with some embodiments of the disclosure. In some embodiments, the portion of the sacrificial layer 152 is removed by an etching process, such as a wet etching process or a dry etching process.

Figure 2E:
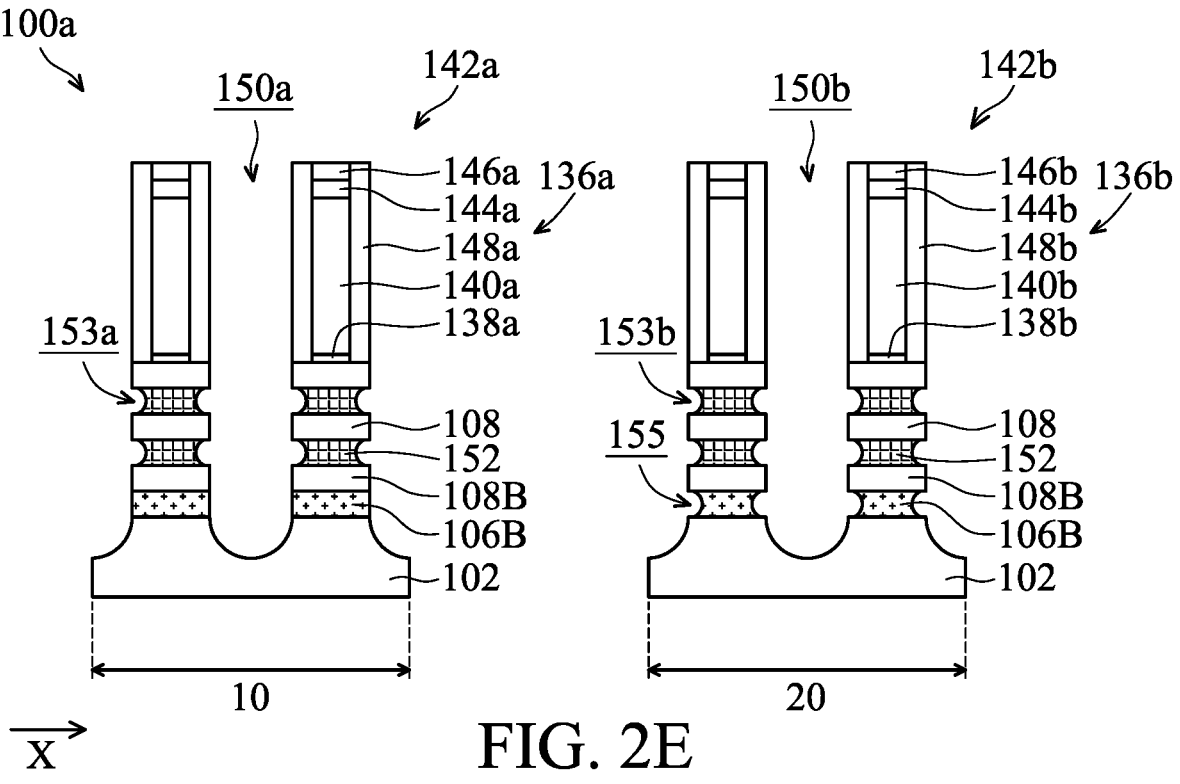

Afterwards, as shown in FIG. 2E, a portion of the bottommost first semiconductor layer 106B is removed in the second region 20 to form an opening 155, in accordance with some embodiments of the disclosure. The portion of the semiconductor device structure 100a in the first region 10 is covered by a mask structure (not shown) and is not removed.

In some embodiments, the sidewall of the opening 155 is substantially aligned with the sidewall of the second notch 153b in the second region 20.

Figure 2F:
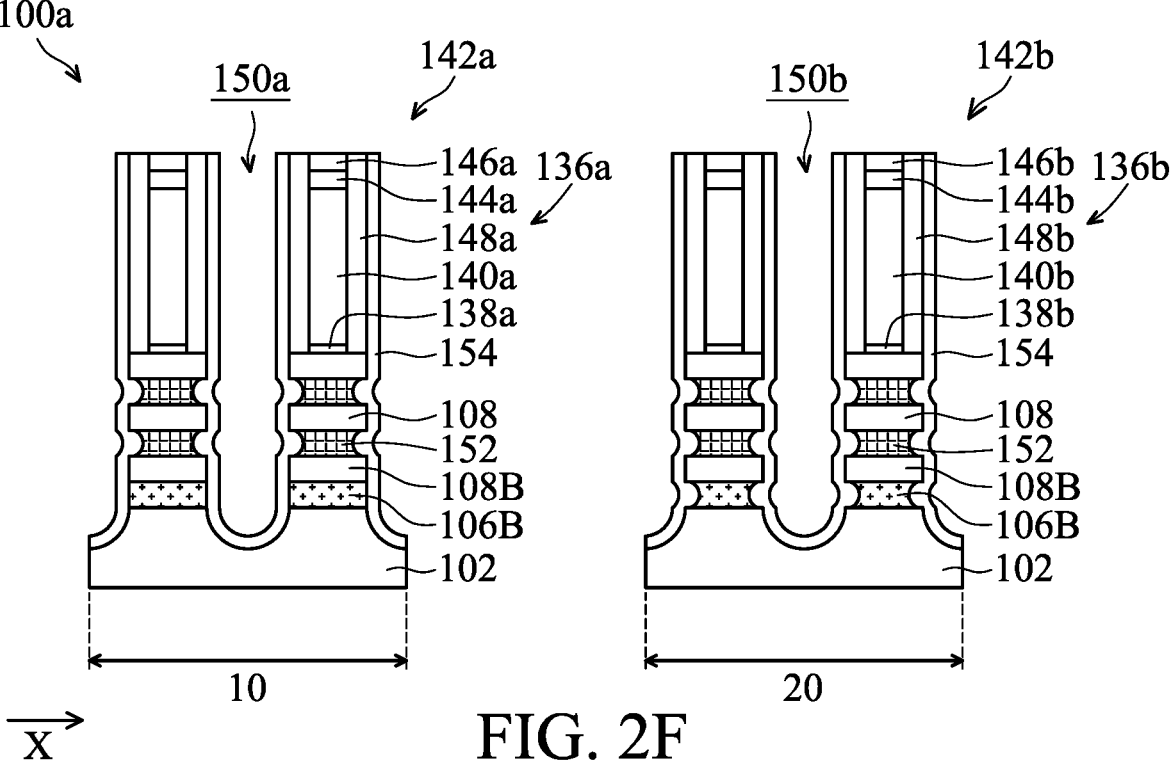

Next, as shown in FIG. 2F, a spacer material 154 is formed in the first S/D trench 150a, the second S/D trench 150b, the first notch 153a, the second notch 153b and the opening 157, in accordance with some embodiments of the disclosure.

Figure 2G:
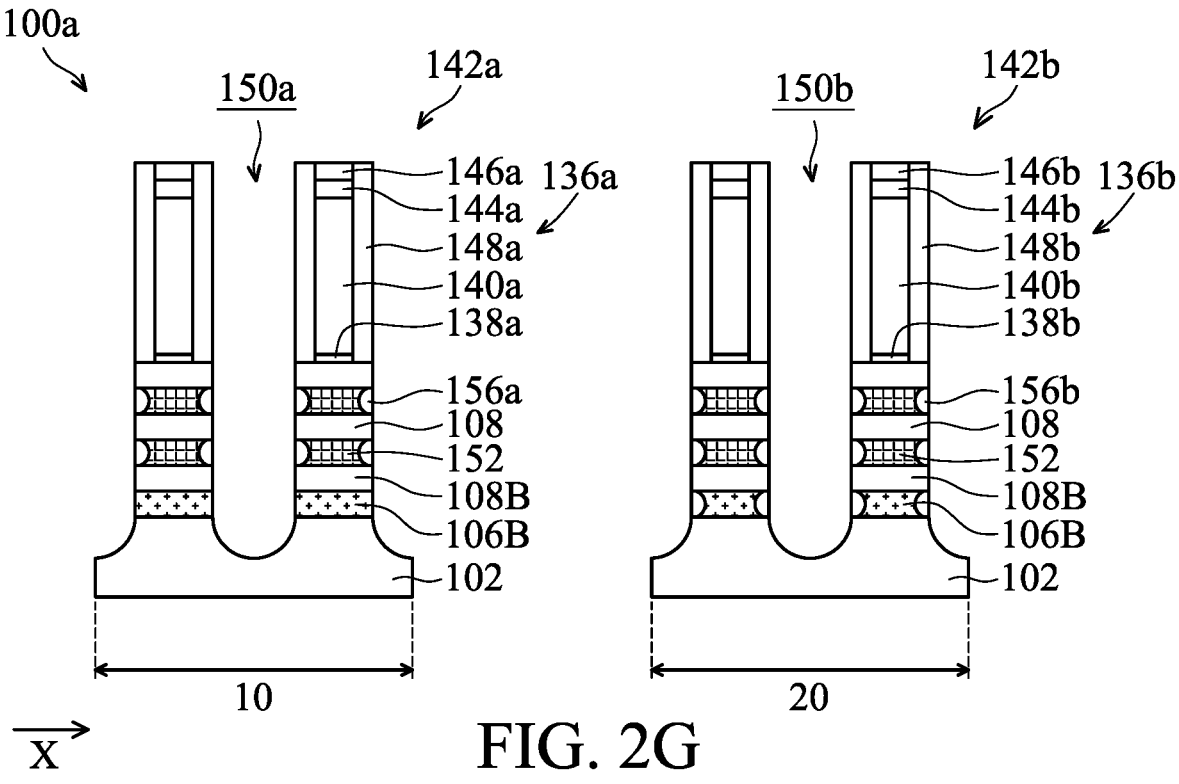

Afterwards, as shown in FIG. 2G, a portion of the spacer material 154 is removed to form a first inner spacer 156a in the first region 10 and a second inner spacer 156b in the second region 20, in accordance with some embodiments of the disclosure. The bottommost surface of the second inner spacer 156b in the second region 20 is lower than the bottommost surface of the first inner spacer 156a in the first region 10.

The first inner spacers 156a and the second inner spacers 156b are configured to as barriers between an S/D structure (formed later) and a gate structure (formed later). The first inner spacers 156a and the second inner spacers 156b can reduce the parasitic capacitance between the S/D structure (formed later) and the gate structure (formed later).

In some embodiments, the first inner spacers 156a have curved sidewalls. In some embodiments, the second inner spacers 156b have curved sidewalls. In some embodiments, the first inner spacers 156a and the second inner spacers 156b are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof.

Figure 2H:
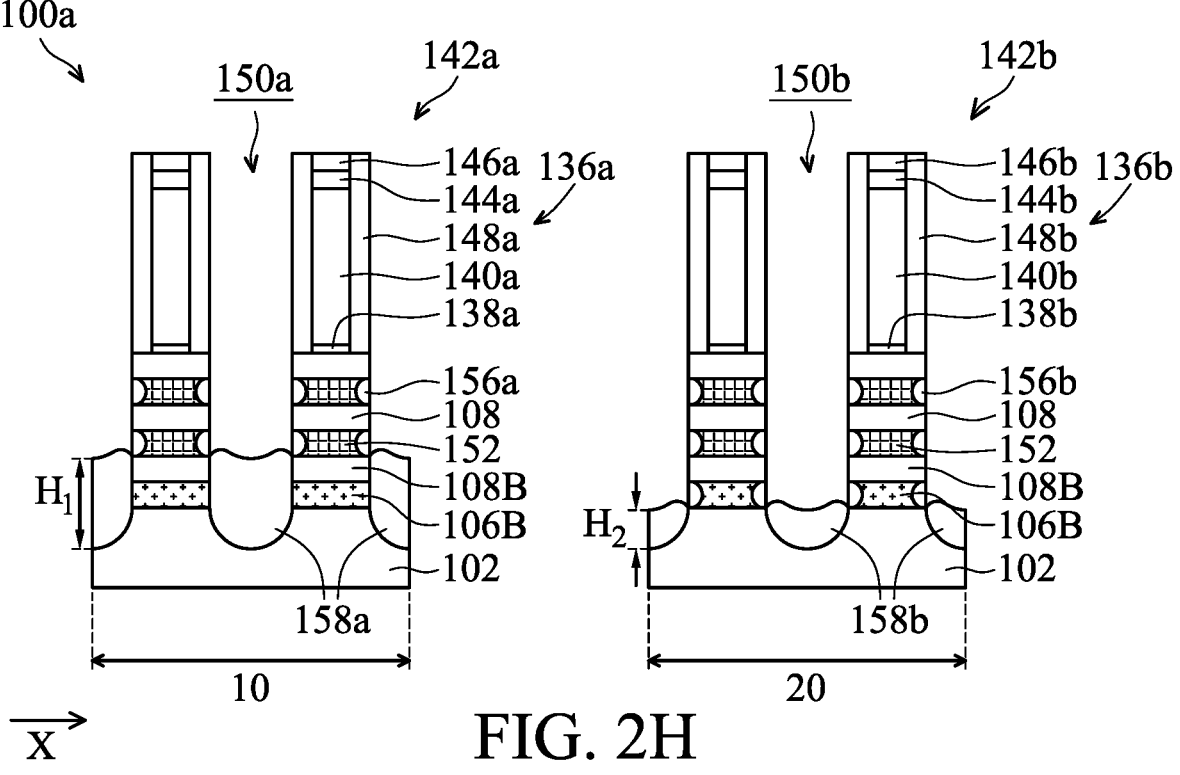

Next, as shown in FIG. 2H, a first dummy layer 158a is formed in the first S/D recess 150a over the first region 10, and a second dummy layer 158b is formed in the second S/D recess 150b over the second region 20, in accordance with some embodiments of the disclosure. The first dummy layer 158a and the second dummy layer 158b are formed to reduce the leakage current.

The top surface of the first dummy layer 158a in the first region 10 is higher than the top surface of the second dummy layer 158b in the second region 20. The top surface of the first dummy layer 158a in the first region 10 is higher than the bottommost surface of the first inner spacer 156a. In some embodiments, the first dummy layer 158a has a first height $H_1$, and the second dummy layer 158b has a second height $H_2$. In some embodiments, the first height $H_1$ of the first dummy layer 158a is greater than the second height $H_2$ of the second dummy layer 158b. In some embodiments, the first height $H_1$ of the first dummy layer 158a is in a range from about 5 nm to about 50 nm.

The first dummy layer 158a and the second dummy layer 158b are used to define the locations of a first insulating layer 164a (formed later) and a second insulating layer 164b (formed later), and to further define the effective nanostructure number (e.g. nanosheet number) and to achieve multi-nanostructures (e.g. multi-nanosheets) co-exist.

In some embodiments, the first dummy layer 158a and the second dummy layer 158b are simultaneously formed. In some embodiments, the first dummy layer 158a and the second dummy layer 158b independently include un-doped Si, un-doped SiGe or a combination thereof. In some embodiments, the first dummy layer 158a and the second dummy layer 158b independently are formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

Figure 2I:
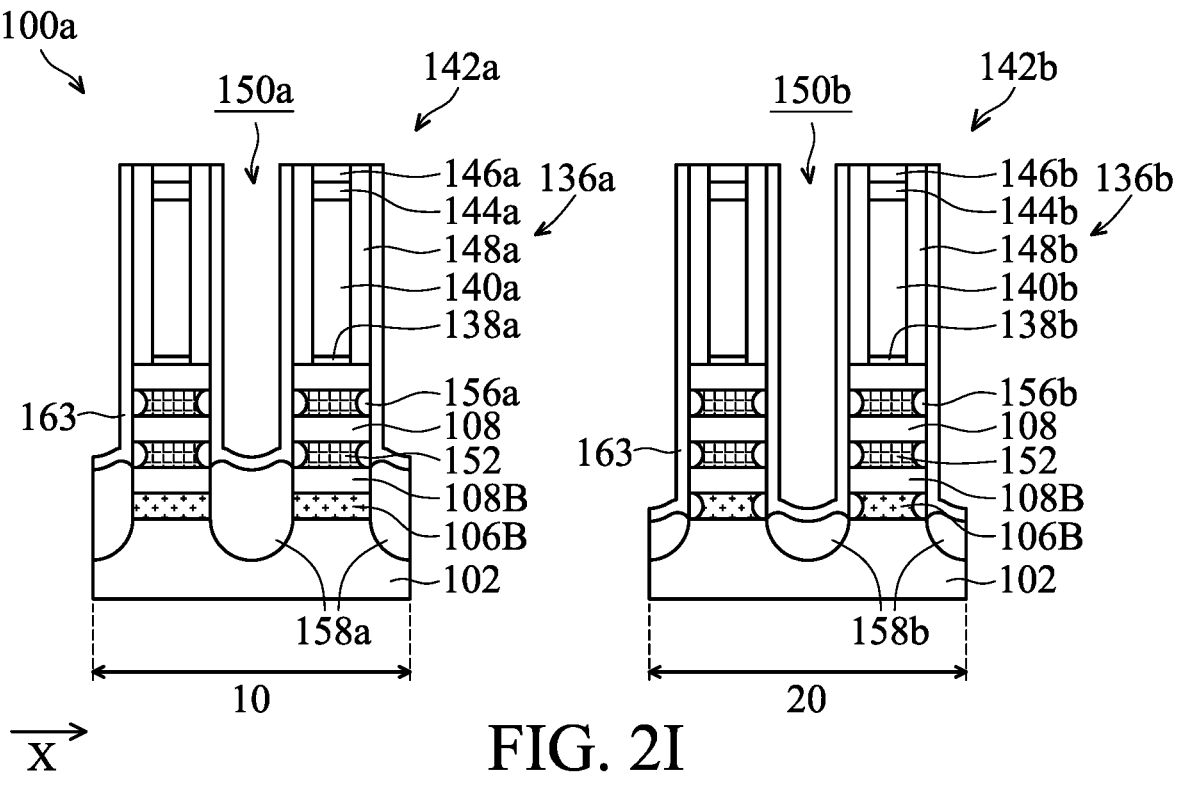

Afterwards, as shown in FIG. 2I, an insulating material 163 is formed in the first S/D trench 150a and the second S/D trench 150b, on the first dummy layer 158a and the second dummy layer 158b and the first dummy gate structure 136a, the second dummy gate structure 136b, in accordance with some embodiments of the disclosure. More specifically, the insulating material 163 is conformally over the first gate spacer 148a, the second gate spacer 148b, the first dummy layer 158a, the second dummy layer 158b, the first inner spacer 156a and the second inner spacer 156b.

Figure 2J:
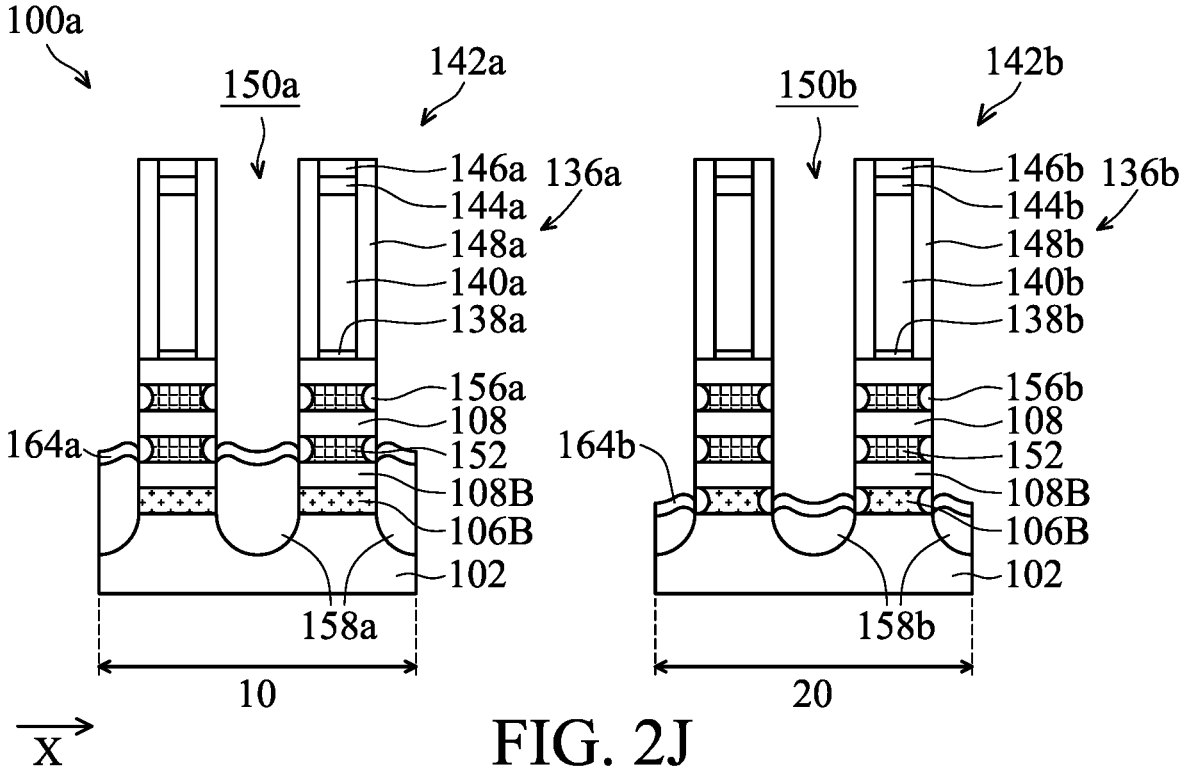

Next, as shown in FIG. 2J, a portion of the insulating material 163 is removed to form a first insulating layer 164a and a second insulating layer 164b, in accordance with some embodiments of the disclosure. The first insulating layer 164a and the second insulating layer 164b are used to further reduce the leakage current since they are made of insulating materials. The top surface of the first insulating layer 164a is higher than the top surface of the second insulating layer 164b since the top surface of the first dummy layer 158a in the first region 10 is higher than the top surface of the second dummy layer 158b in the second region 20.

Since the bottom portion is thicker than the sidewall portion of the insulating material 163, the bottom portion is left while the sidewall portion of the insulating material 163 is removed. In some embodiments, the first insulating layer 164a has a curved top surface. In some embodiments, the top surface of the first insulating layer 164a is convex. In addition, the second insulating layer 164b is also has a curved top surface, and the top surface of the second insulating layer 164b is convex.

The height of one of the first inner spacers 156a is greater than the height of the first insulating layer 164a along a vertical direction (Z-axis) in the first region 10. The height of one of the second inner spacers 156b is greater than the height of the second insulating layer 164b in the second region 20. The first insulating layer 164a is in direct contact with the first inner spacers 156a in the first region 10. The second insulating layer 164b is in direct contact with the second inner spacers 156b in the second region 20.

The height of the first insulating layer 164a is about 20% to about 80% of the distance between two adjacent nanostructures 108'. In some embodiments, the height of the first insulating layer 164a is about 0.1 nm to about 15 nm. In some embodiments, the height of the second insulating layer 164b is about 0.1 nm to about 15 nm.

In some embodiments, the first insulating layer 164a and the second insulating layer 164b independently made of SiN, SiCN, SiOCN, SiOC, SiON, SiOx, AlOx, HfOx, low-k or another applicable material. When the first insulating layer 164a and the second insulating layer 164b are made of low-k materials, the unwanted parasitic capacitance is further reduced. In some embodiments, the first insulating layer 164a and the second insulating layer 164b are formed by a deposition process, such as CVD process, ALD process, another applicable process, or a combination thereof. In some embodiments, the first insulating layer 164a and the second insulating layer 164b are formed by a PEALD process, and the precursor includes dichlorosilane, and $NH_3$.

Figure 2K:
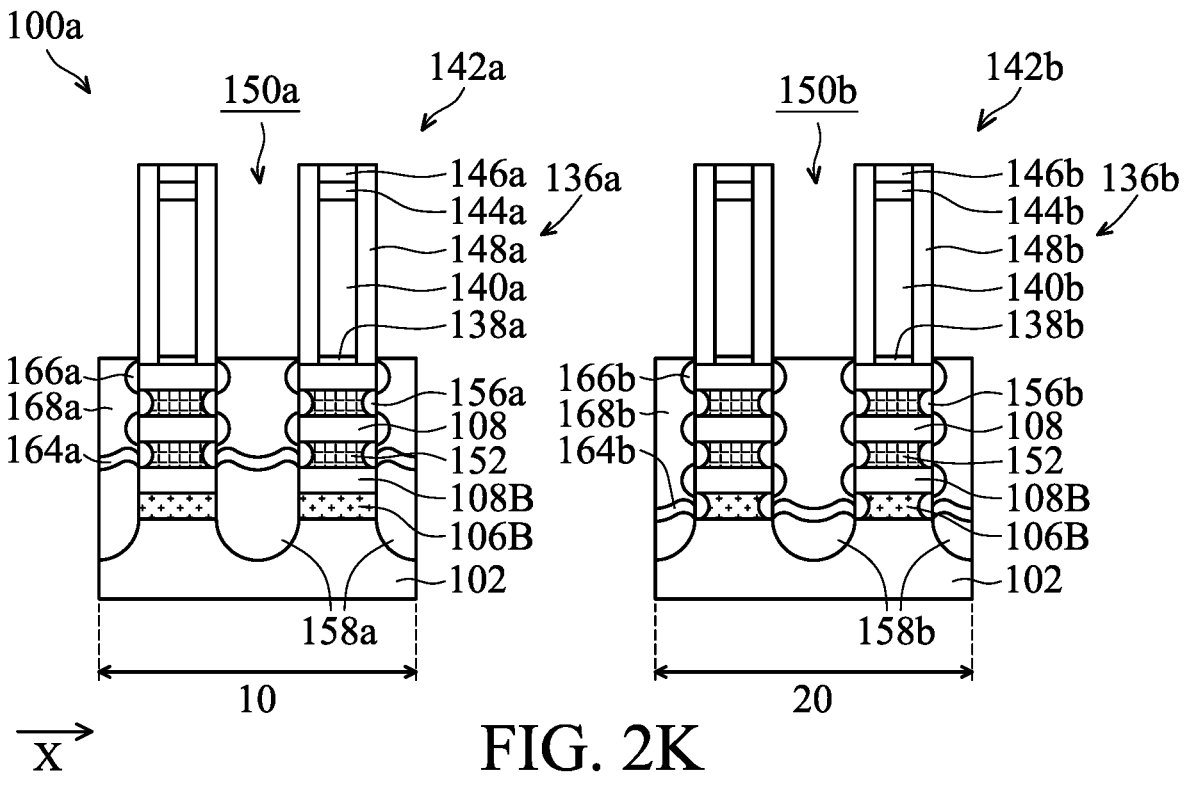

Afterwards, as shown in FIG. 2K, first S/D structures are formed over the first insulating layer 164a, and second S/D structures are formed over the second insulating layer 164b, in accordance with some embodiments of the disclosure.

In some embodiments, the first S/D structures includes the sub-portion 166a and the sub-portion 168a which are made of the same materials but have different doping concentrations. The first S/D structures including sub-portions 166a, 168a are isolated from the first dummy layer 158a by the first insulating layer 164a over the first region 10. The first insulating layer 164a in the first region 10 is between and in direct contact with the first dummy layer 158a and the first S/D structures including sub-portions 166a, 168a.

In some embodiments, the second S/D structures includes the sub-portion 166b and the sub-portion 168b which are made of the same materials but have different doping concentrations. The second S/D structures including sub-portions 166b, 168b are isolated from the second dummy layer 158b by the second insulating layer 164b over the second region 20.

In some embodiments, the height of the first S/D structure including sub-portions 166a, 168a is smaller than the height of the second S/D structure including sub-portions 166b, 168b. In some embodiments, the bottom surface of the second S/D structure including sub-portions 166b, 168b in the second region 20 is lower than the bottom surface of the first S/D structure including sub-portions 166a, 168a in the first region 10.

The first S/D structure including sub-portions 166a, 168a and the second S/D structure including sub-portions 166b, 168b may independently include silicon germanium (SiGe), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), or a combination thereof. The first S/D structure including sub-portions 166a, 168a and the second S/D structure including sub-portions 166b, 168b may dope with one or more dopants. In some embodiments, the first S/D structure including sub-portions 166a, 168a or the second S/D structure including sub-portions 166b, 168b is silicon (Si) doped with phosphorus (P), arsenic (As), antimony (Sb), or another applicable dopant. Alternatively, the first S/D structure including sub-portions 166a, 168a or the second S/D structure including sub-portions 166b, 168b is silicon germanium (SiGe) doped with boron (B) or another applicable dopant.

In some embodiments, the first S/D structure including sub-portions 166a, 168a and the second S/D structure including sub-portions 166b, 168b are formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

Figure 2L:
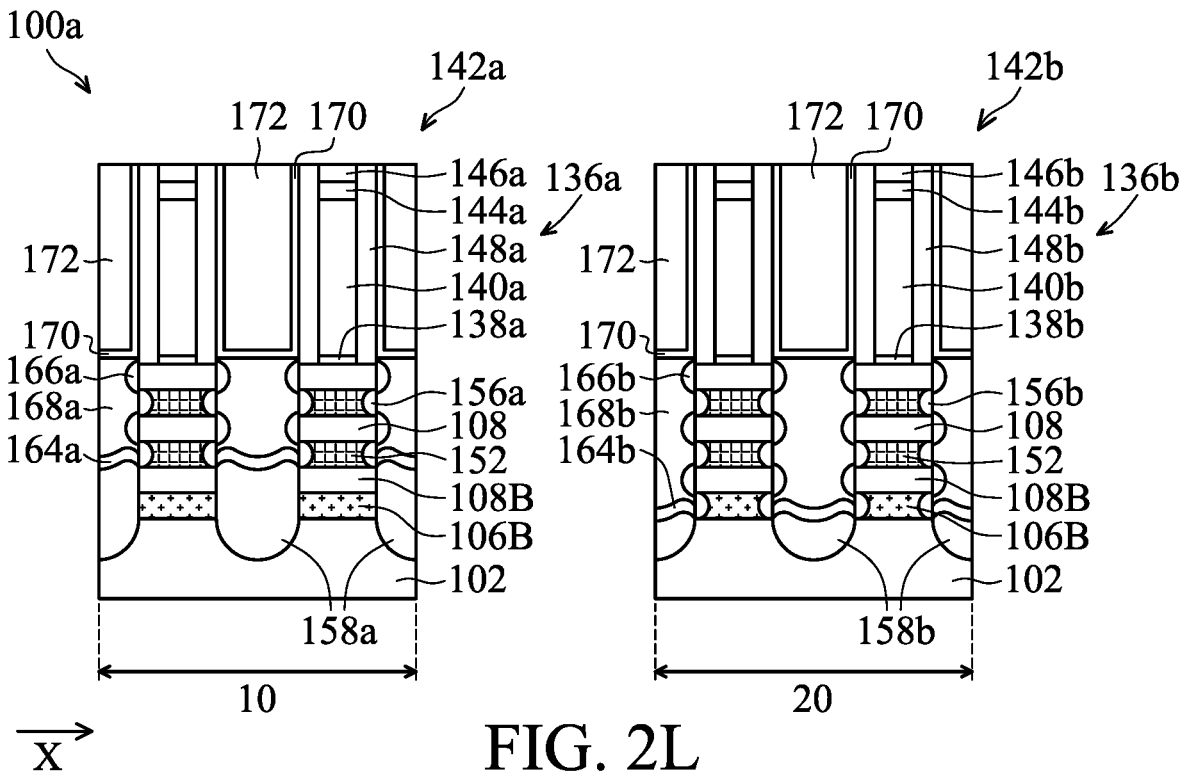

Next, as shown in FIG. 2L, a contact etch stop layer (CESL) 170 is formed over the first S/D structure with sub-portions 166a, 168a and the second S/D structure with sub-portions 166b, 168b, and an inter-layer dielectric (ILD) layer 172 is formed over the CESL 170, in accordance with some embodiments. Next, a portion of the ILD layer 172 is removed to expose the top surface of the first dummy gate electrode layer 140a and the top surface of the second dummy gate electrode layer 140b. In some embodiments, the portion of the ILD layer 172 is removed by a planarizing process, a chemical mechanical polishing (CMP) process.

In some embodiments, the CESL 170 is made of a dielectric materials, such as silicon nitride, silicon oxide, silicon oxynitride, another suitable dielectric material, or a combination thereof. The dielectric material for the CESL 170 may be conformally deposited over the semiconductor device structure 100a by performing CVD, ALD, other application methods, or a combination thereof.

The ILD layer 172 may include multilayers made of multiple dielectric materials, such as silicon oxide, silicon nitride, silicon oxynitride, phosphosilicate glass (PSG), borophosphosilicate glass (BPSG), or other applicable low-k dielectric materials. The ILD layer 172 may be formed by chemical vapor deposition (CVD), physical vapor deposition, (PVD), atomic layer deposition (ALD), or other applicable processes.

Figure 3:
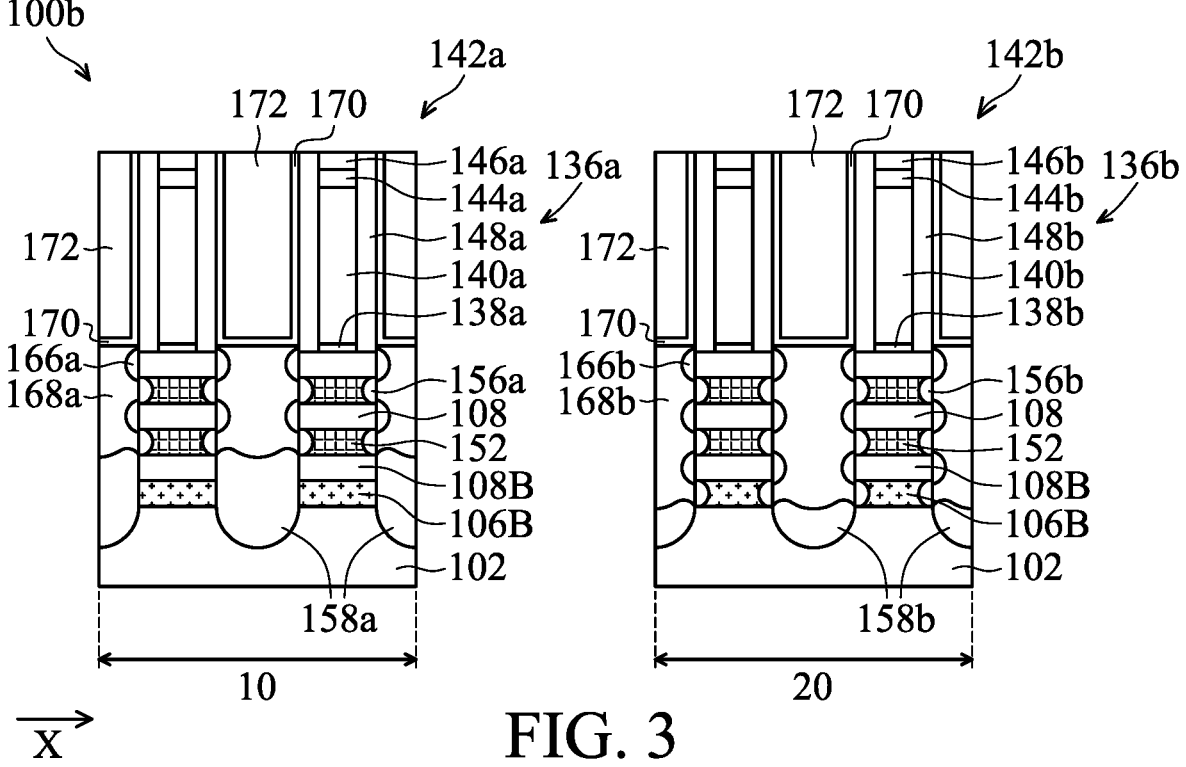
FIG. 3 shows a cross-sectional representation of a semiconductor device structure, in accordance with some embodiments of the disclosure.

FIG. 3 shows a cross-sectional representation of a semiconductor device structure 100b, in accordance with some embodiments of the disclosure.

The semiconductor device structure 100b of FIG. 3 includes elements that are similar to, or the same as, elements of the semiconductor device structure 100a of FIG. 2L, the difference between the FIG. 3 and FIG. 2L is that no first insulating layer is on the first dummy layer 158a in the first region 10, and no second insulating layer is on the second dummy layer 158b in the second region 20.

Figures 1, 4A:
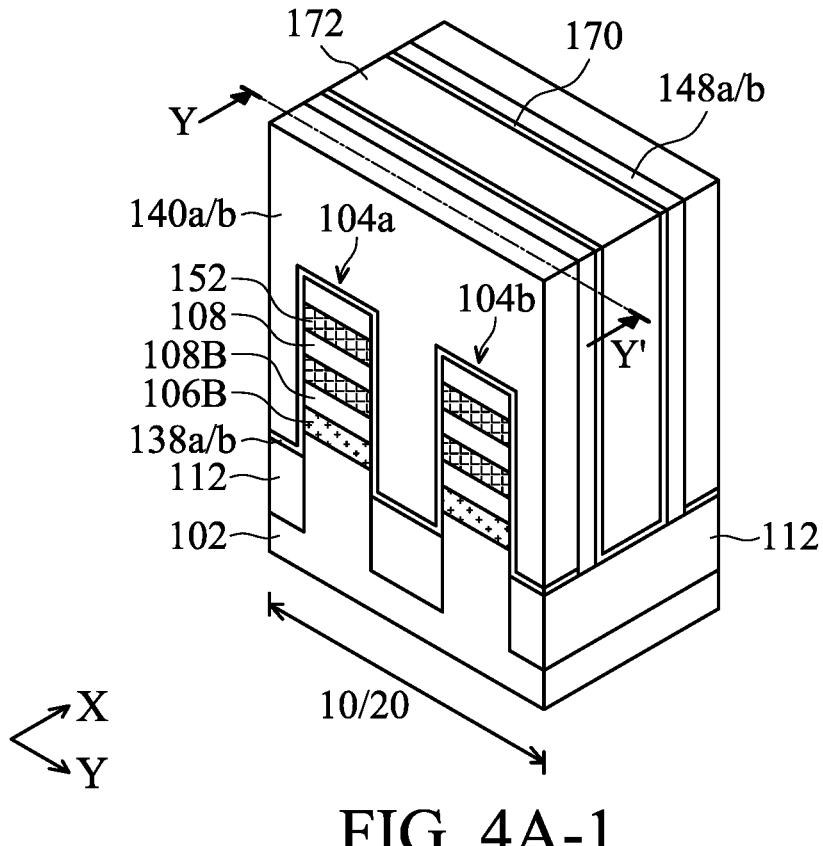
FIGS. 4A-1-4G-1 show perspective views of various stages of forming the semiconductor device structure after FIG. 2L, in accordance with some embodiments of the disclosure.
Figures 2, 4A:
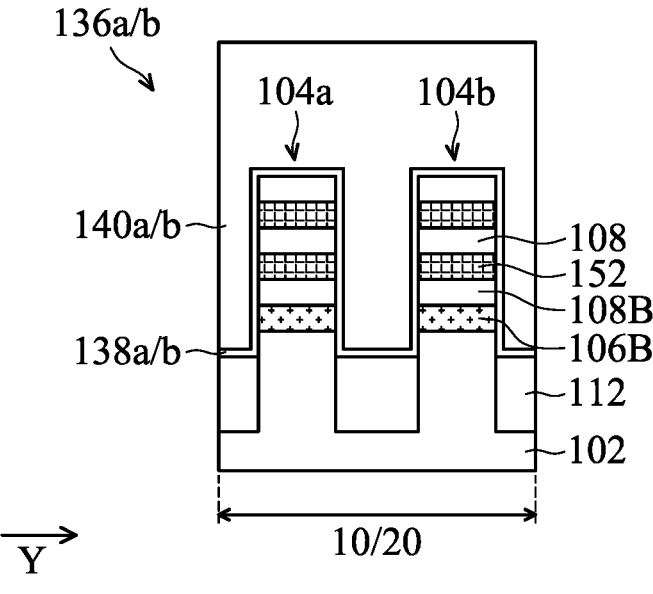
Figures 1, 4B:
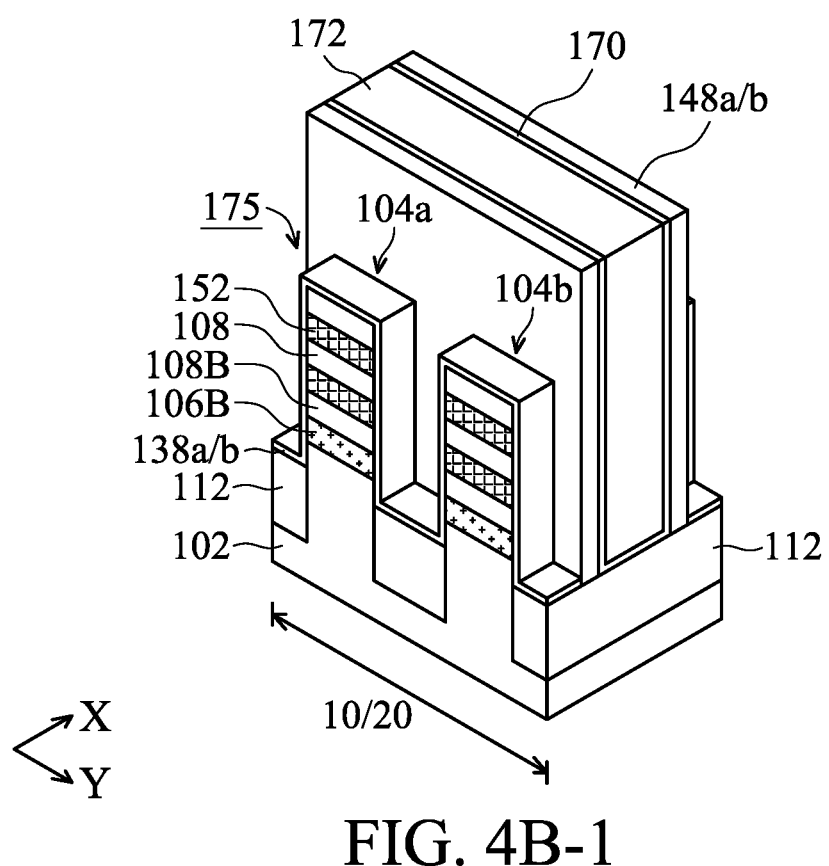
Figures 2, 4B:
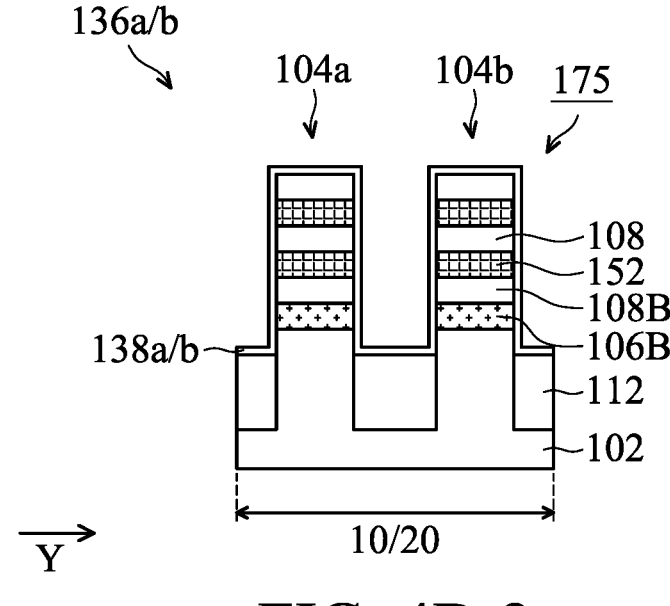
Figures 1, 4C:
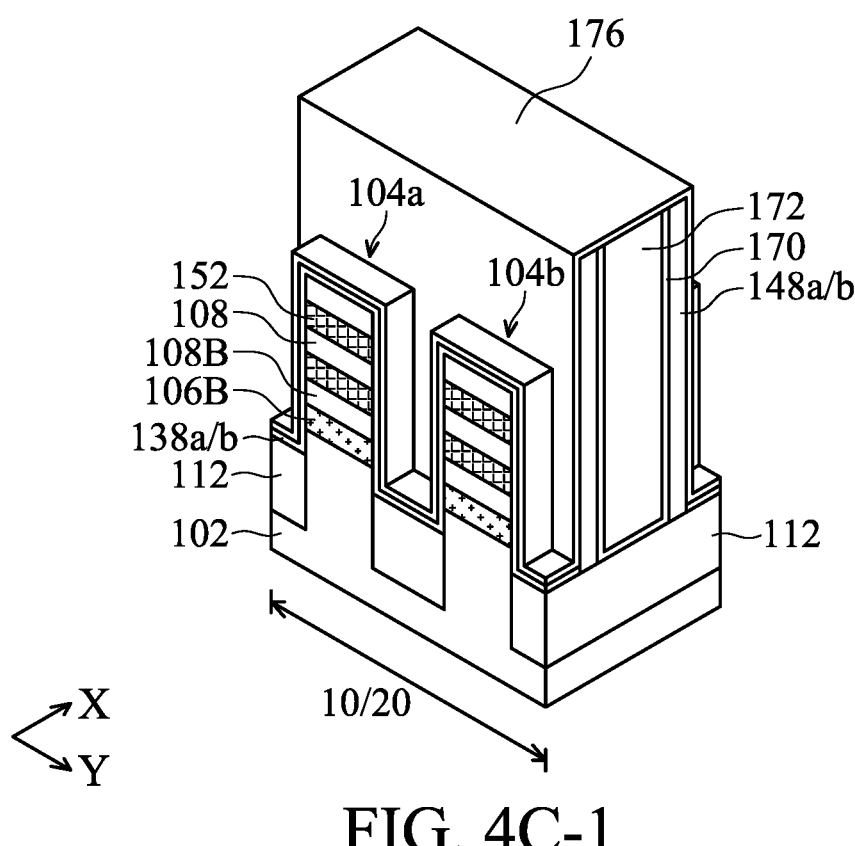
Figures 2, 4C:
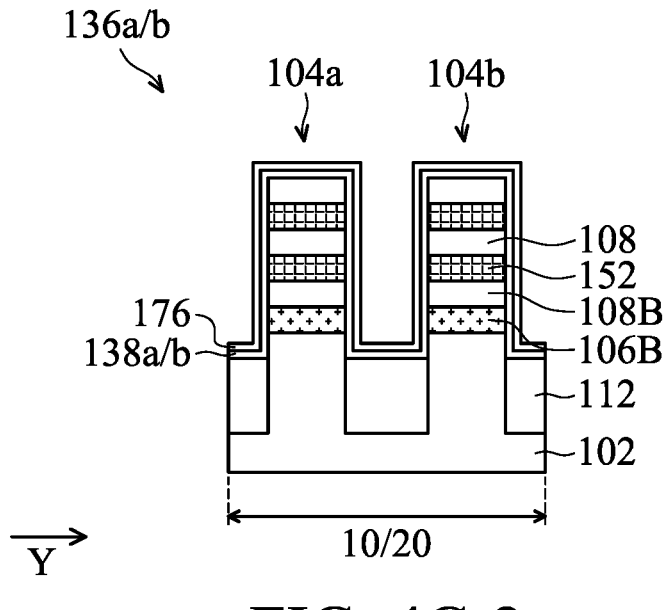
Figures 1, 4D:
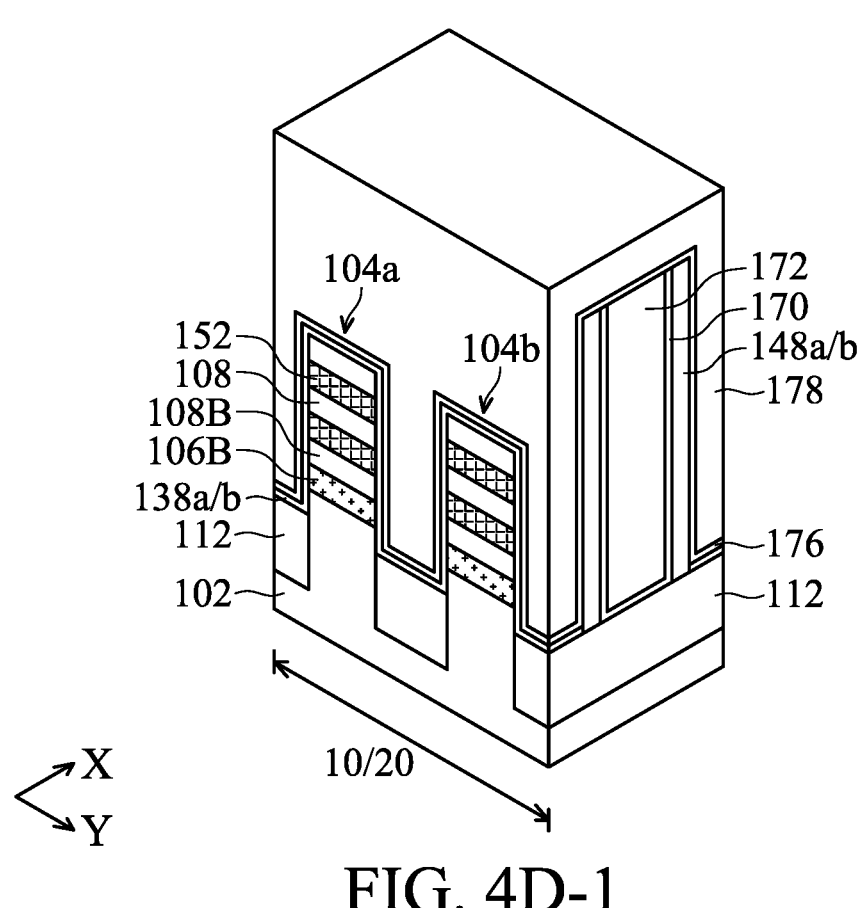
Figures 2, 4D:
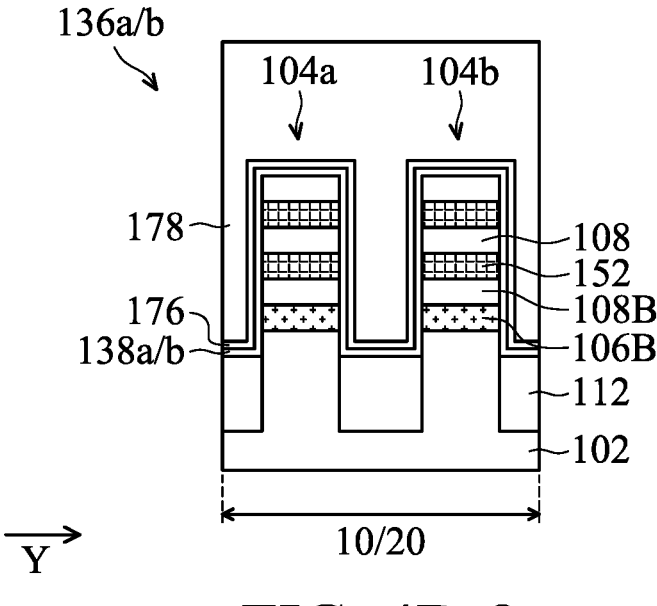
Figures 1, 4E:
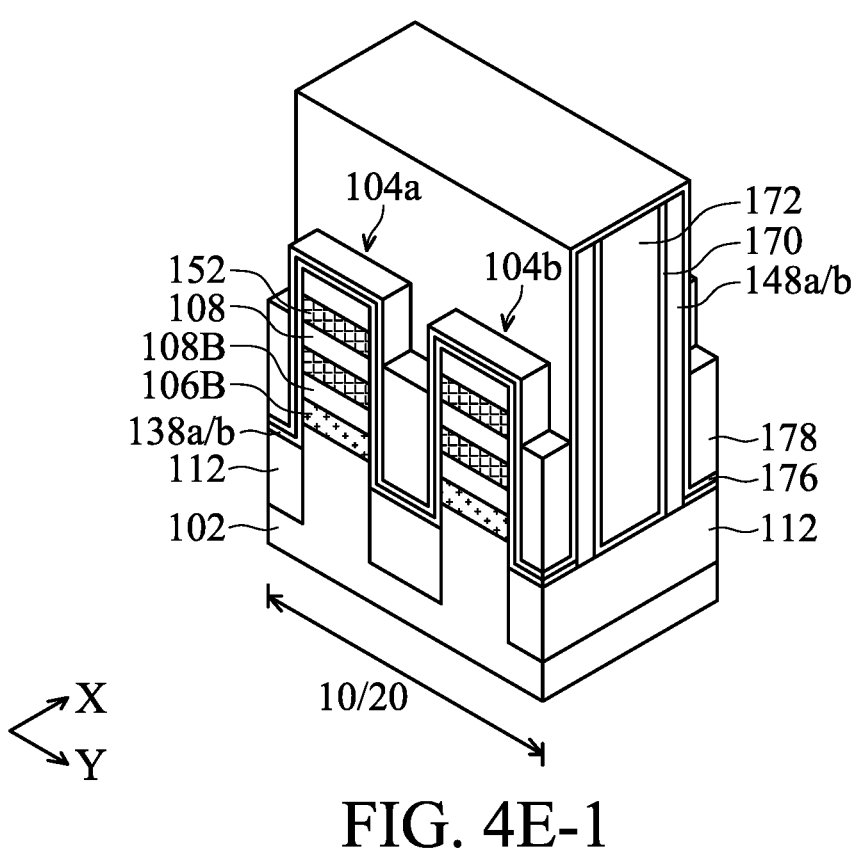
Figures 2, 4E:
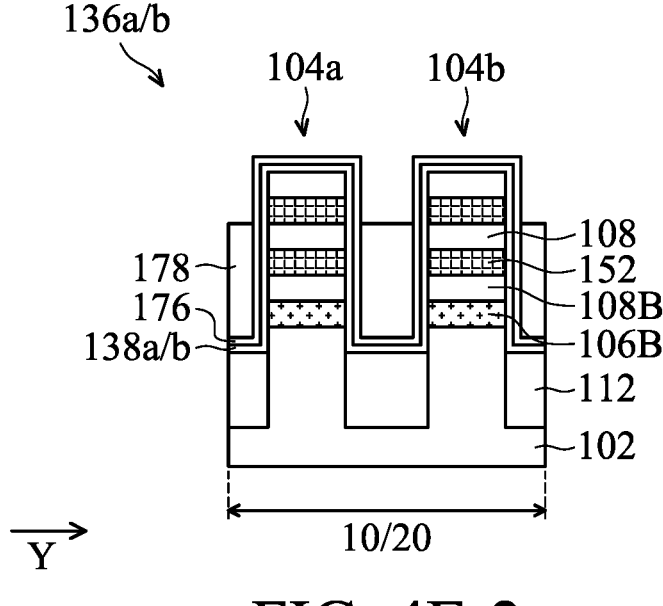
Figures 1, 4F:
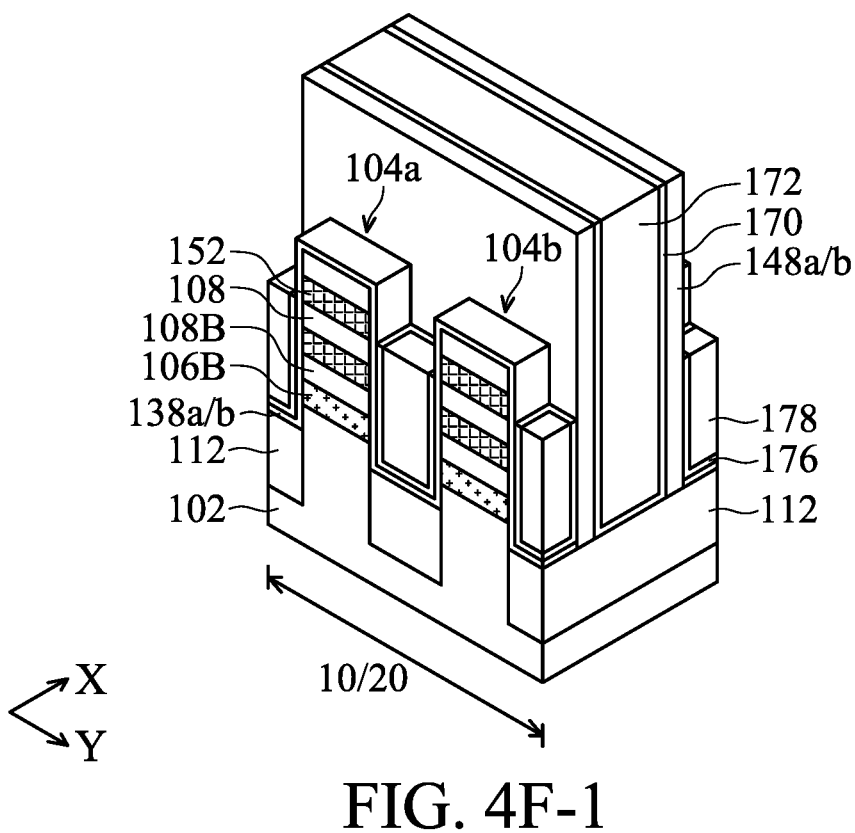
Figures 2, 4F:
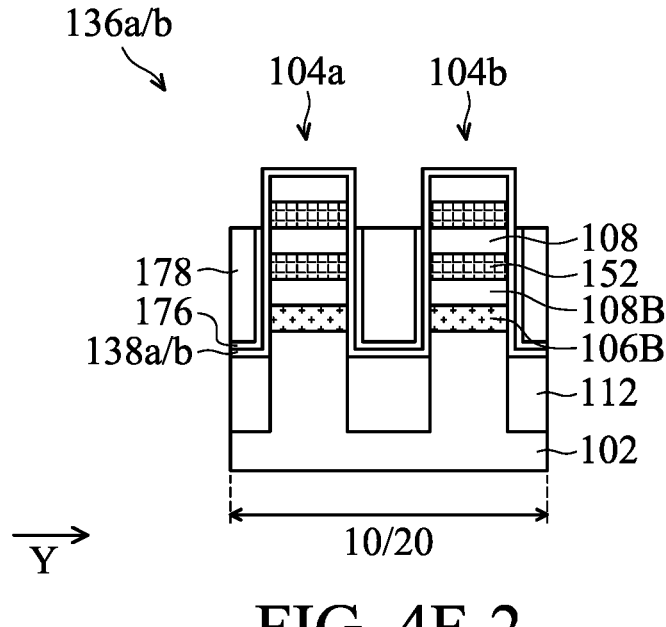
Figures 1, 4G:
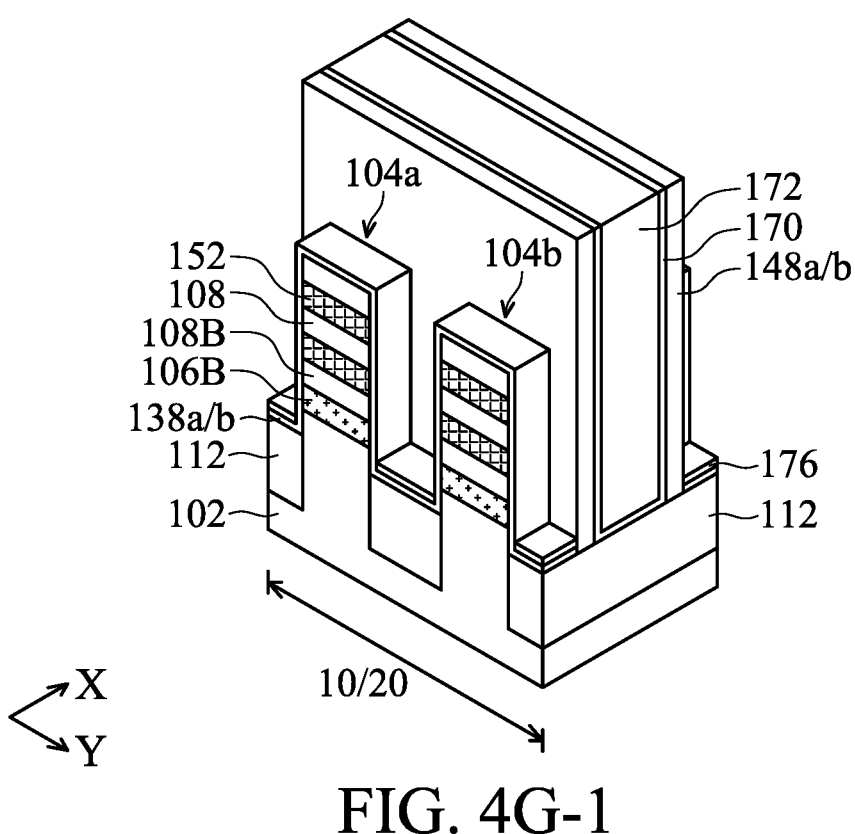
Figures 2, 4G:
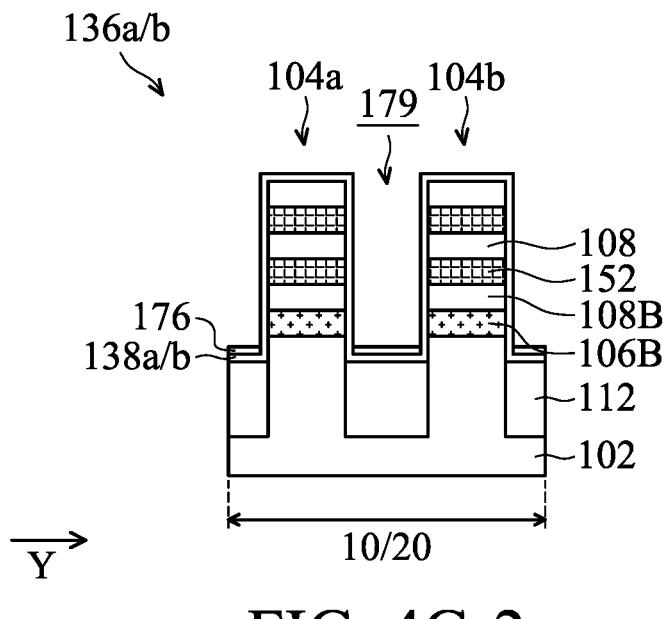

FIGS. 4A-1-4G-1 show perspective views of various stages of forming the semiconductor device structure 100a after FIG. 2L, in accordance with some embodiments of the disclosure. FIG. 4A-2-4G-2 show cross-sectional representations of various stages of forming the semiconductor device structure 100a along line Y-Y' shown in FIG. 4A-1, in accordance with some embodiments of the disclosure. FIGS. 4A-1-4G-1 and FIG. 4A-2-4G-2 show the semiconductor device structure 100a in the first region 10 and the second region 20.

As shown in FIGS. 4A-1 and 4A-2, the dummy gate structure 136a/b having the dummy gate dielectric layer 138a/b and the dummy gate electrode layer 140a/b is formed over the first stack structure 104a and the second stack structure 104b, in accordance with some embodiments of the disclosure.

Next, as shown in FIGS. 4B-1 and 4B-2, the dummy gate electrode layer 140a/b is removed to form a trench 175, in accordance with some embodiments of the disclosure. As a result, the dummy gate dielectric layer 138a/b is exposed by the trench 175.

Afterwards, as shown in FIGS. 4C-1 and 4C-2, a hard mask layer 176 is formed over the dummy gate dielectric layer 138a/b over the isolation structure 112, in accordance with some embodiments of the disclosure. More specifically, the hard mask layer 176 is conformally formed on the dummy gate dielectric layer 138a/b over the isolation structure 112.

The hard mask layer 176 is configured to protect the underlying layers (e.g. the dummy gate dielectric layer 138a/b when the subsequent etching process is performed. In some embodiments, the thickness of the hard mask layer 176 along the vertical direction (e.g. Z-axis) is in a range from about 5 nm to about 50 nm.

Next, as shown in FIGS. 4D-1 and 4D-2, a photoresist layer 178 is formed over the hard mask layer 176, in accordance with some embodiments of the disclosure. The photoresist layer 178 is used to define the location of the hard mask layer 176.

Afterwards, as shown in FIGS. 4E-1 and 4E-2, a portion of the photoresist layer 178 is removed to expose the top surface of the first stack structure 104a and the top surface of the second stack structure 104b, in accordance with some embodiments of the disclosure. The topmost surface of the photoresist layer 178 is lower than the top surface of the first stack structure 104a and the top surface of the second stack structure 104b.

Next, as shown in FIGS. 4F-1 and 4F-2, the exposed hard mask layer 176 is removed which is not covered by the photoresist layer 178, in accordance with some embodiments of the disclosure. As a result, the topmost surface of the dummy gate dielectric layer 138*a/b* is exposed.

Afterwards, as shown in FIGS. 4G-1 and 4G-2, the remaining photoresist layer 178 is removed, and then the sidewall portion of the hard mask layer 176 is removed, in accordance with some embodiments of the disclosure. As a result, a trench 179 is formed.

Since the bottom horizontal portion of the hard mask layer 176 is thicker than the vertical sidewall portion of the hard mask layer 176, the bottom horizontal portion of the hard mask layer 176 remains after the vertical sidewall portion of the hard mask layer 176 is removed in the etching process.

Figures 1, 5A:
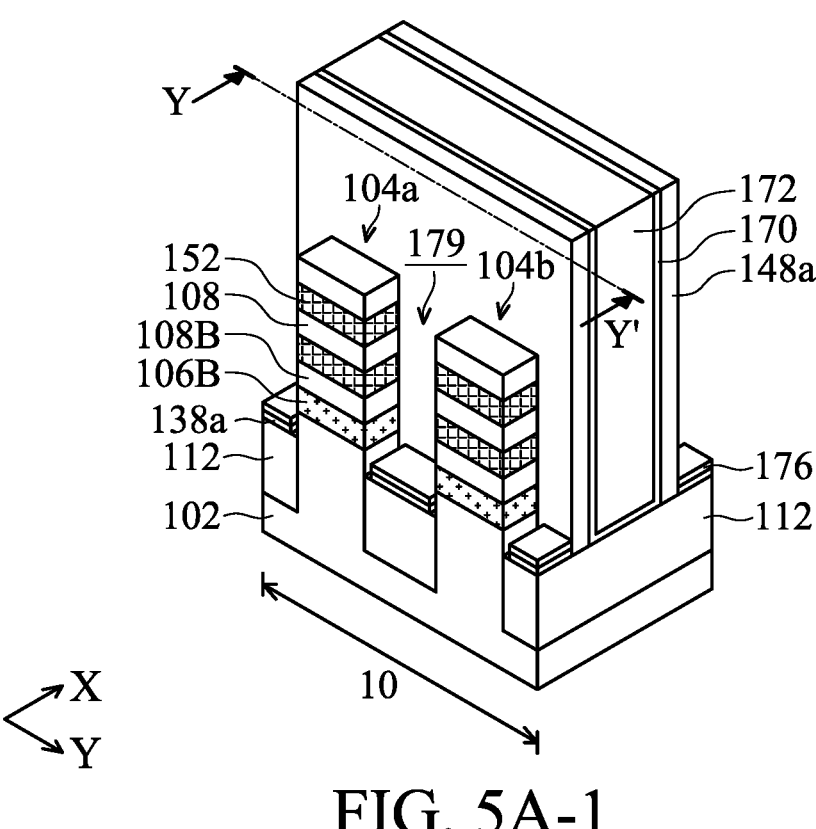
Figures 2, 5A:
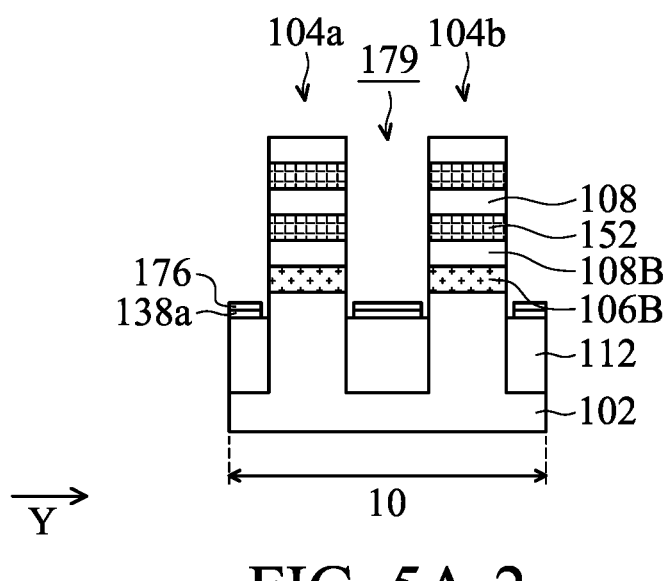
Figures 1, 5B:
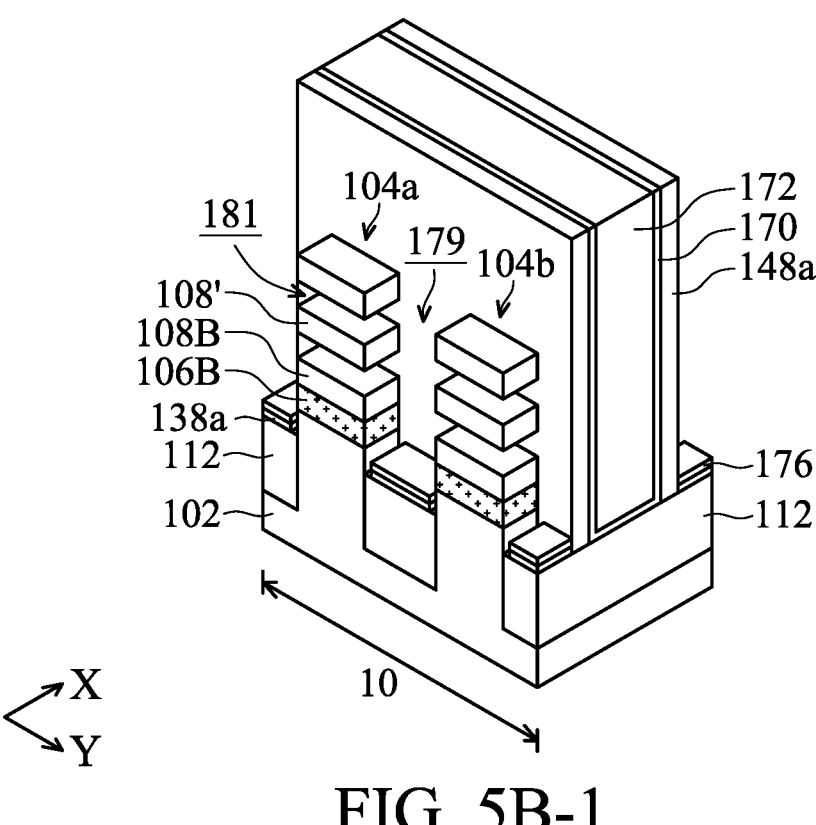
Figures 2, 5B:
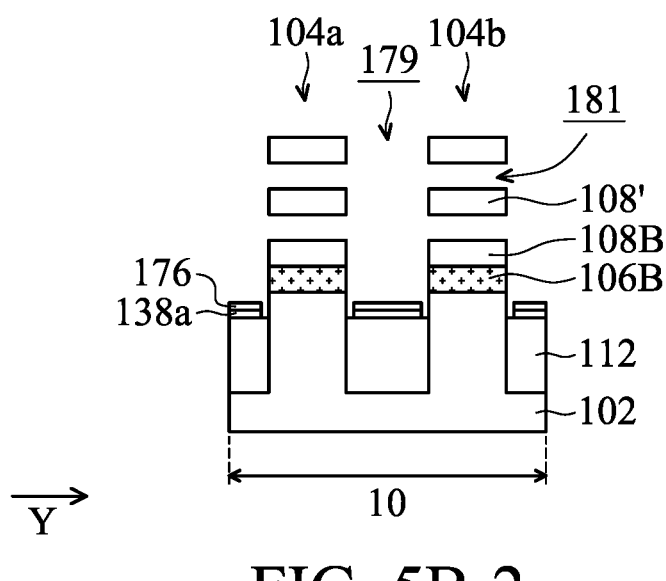
Figures 1, 5C:
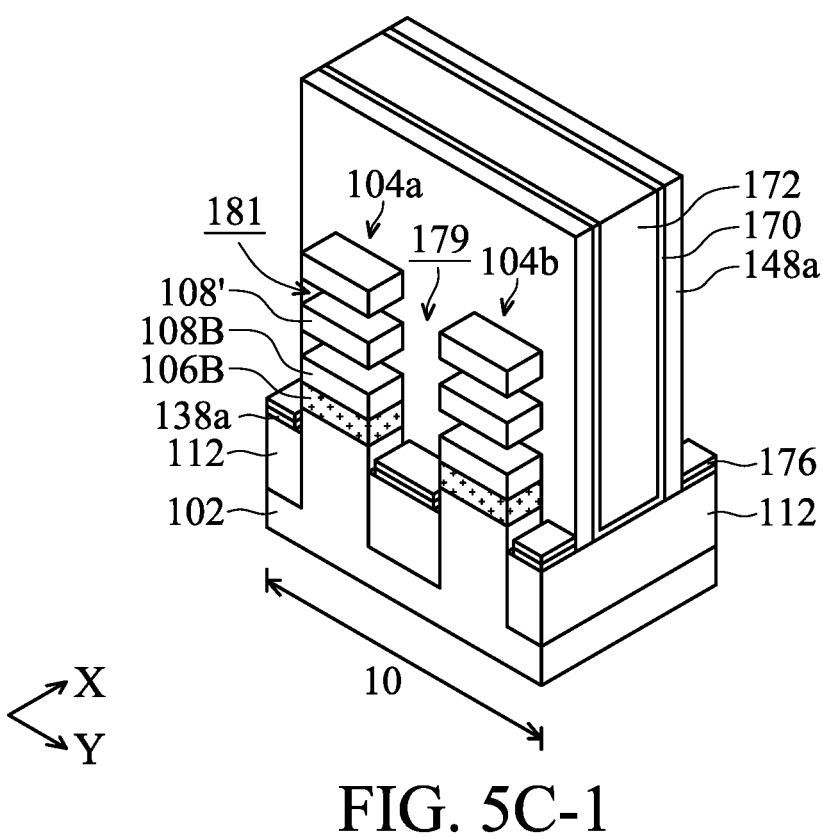
Figures 2, 5C:
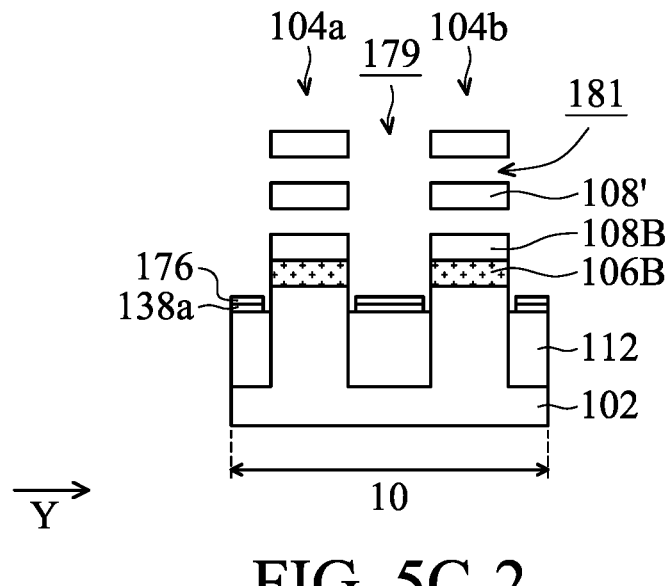
Figures 1, 5D:
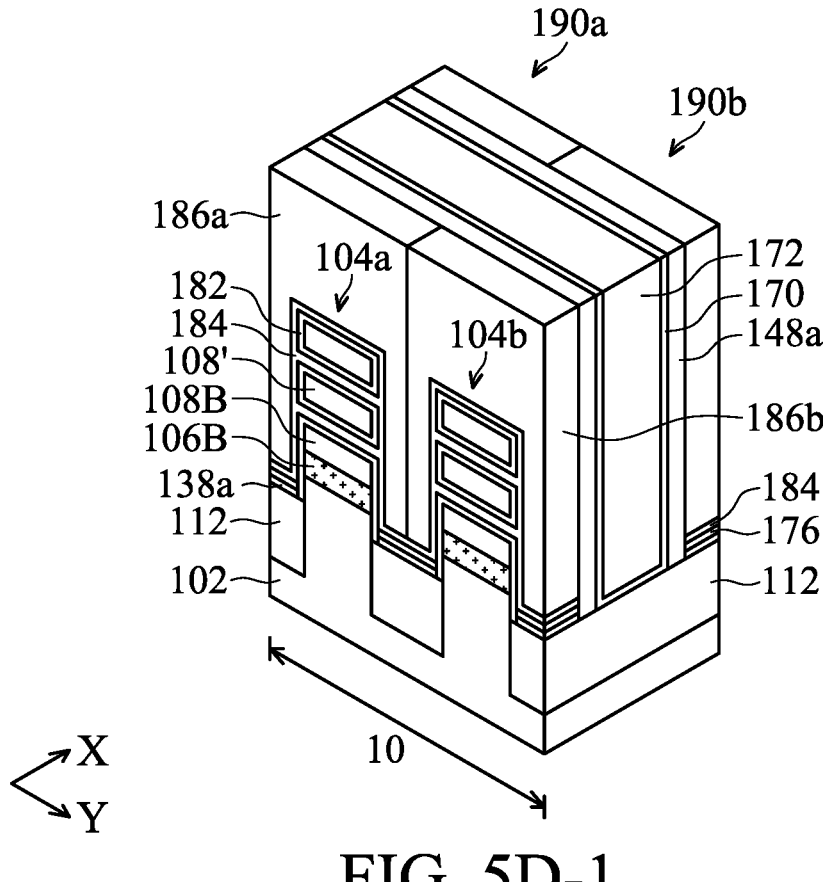
Figures 2, 5D:
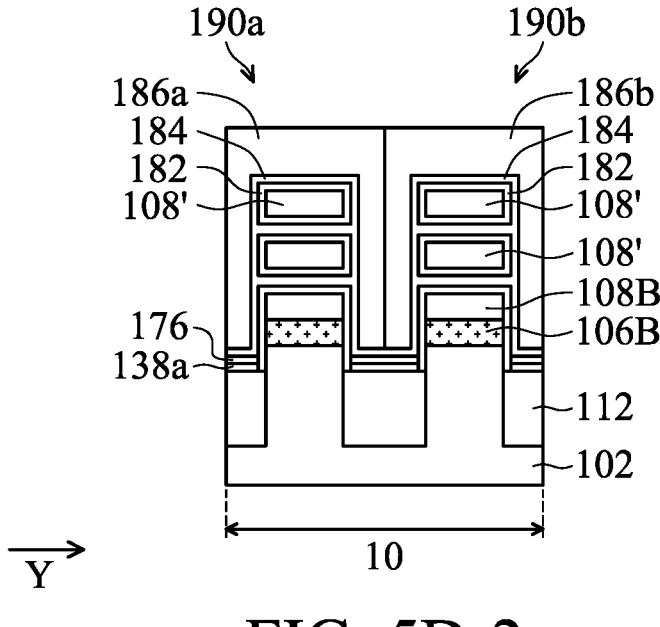

FIGS. 5A-1-5D-1 show perspective views of various stages of forming the semiconductor device structure 100*a* after the structure of FIGS. 4G-1 and 4G-2, in accordance with some embodiments of the disclosure. FIG. 5A-2-5D-2 show cross-sectional representations of various stages of forming the semiconductor device structure 100*a* along line Y-Y' shown in FIG. 5A-1, in accordance with some embodiments of the disclosure. FIGS. 5A-1-5D-1 and FIG. 5A-2-5D-2 show the semiconductor device structure 100*a* in the first region 10.

As shown in FIGS. 5A-1 and 5A-2, the exposed portion of the dummy gate dielectric layer 138*a* is removed in the first region 10, in accordance with some embodiments of the disclosure. The portion of the dummy gate dielectric layer 138*a* that is covered by the hard mask layer 176 remains. As a result, a trench 179 is formed.

Afterwards, as shown in FIGS. 5B-1 and 5B-2, the sacrificial layer 152 is removed to form nanostructures 108', in accordance with some embodiments of the disclosure. In addition, the gaps 181 are formed.

Next, as shown in FIGS. 5C-1 and 5C-2, the semiconductor device structure 100*a* over the first region 10 is covered by the mask layer (not shown), in accordance with some embodiments of the disclosure. Therefore, the semiconductor device structure 100*a* of FIG. 5C-1 is the same as the semiconductor device structure 100*a* of FIG. 5D-1.

Afterwards, as shown in FIGS. 5D-1 and 5D-2, a first gate structure 190*a* is formed in the trench 179 and the gaps 181, and a second gate structure 190*b* is formed in the trench 179 and the gaps 181, in accordance with some embodiments.

As a result, the number of nanostructures 108' (e.g. the second semiconductor layers 108') are surrounded by the first gate structure 190*a*. The portion of the nanostructures 108' in the first region 10 covered by the first gate structure 190*a* can be referred to as a channel region.

The first gate structure 190*a* includes an interfacial layer 182, a gate dielectric layer 184 and a first gate electrode layer 186*a*. The first interfacial layer 182*a* is conformally formed along the main surfaces of the nanostructures 108' (e.g. second semiconductor layers 108) to surround the nanostructures 108'. The second gate structure 190*b* includes an interfacial layer 182, a gate dielectric layer 184 and a second gate electrode layer 186*b*.

In some embodiments, the interfacial layer 182 is oxide layer formed around the nanostructures 108'. In some embodiments, the interfacial layer 182 is formed by performing a thermal process.

In some embodiments, the gate dielectric layer 184 includes a high-k dielectric layer. In some embodiments, the high-k gate dielectric layer is made of one or more layers of a dielectric material, such as HfO$_2$, HfSiO, HfSiON, HfTaO, HfTiO, HfZrO, zirconium oxide, aluminum oxide, titanium oxide, hafnium dioxide-alumina (HfO$_2$-Al2O$_3$) alloy, another suitable high-k dielectric material, or a combination thereof. In some embodiments, the high-k gate dielectric layer is formed using chemical vapor deposition (CVD), atomic layer deposition (ALD), another suitable method, or a combination thereof.

In some embodiments, the first gate electrode layer 186*a* or the second gate electrode layer 186*b* includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof.

In addition, the first gate electrode layer 186*a* or the second gate electrode layer 186*b* may include one or more layers of n-work function layer or p-work function layer. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

Figures 1, 6A:
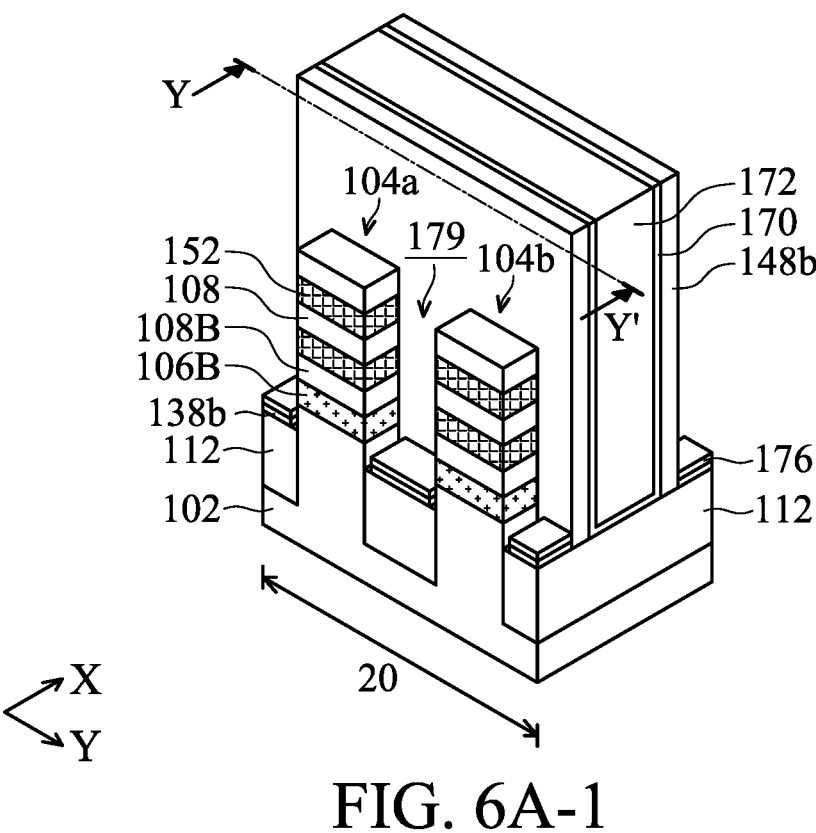
Figures 2, 6A:
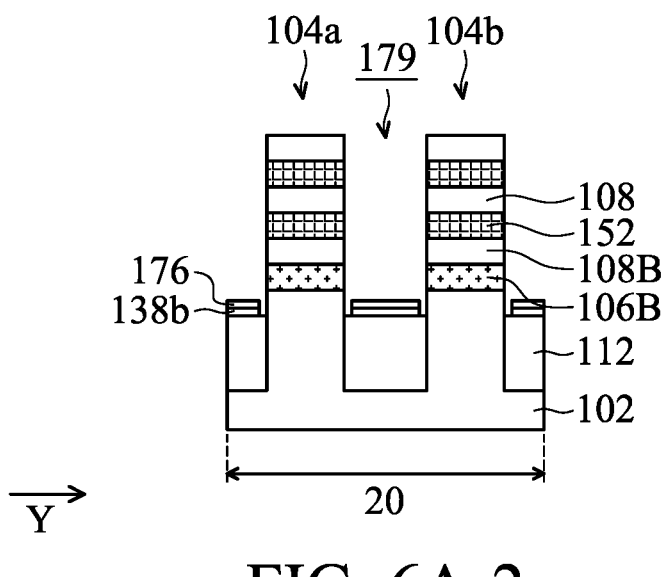
Figures 1, 6B:
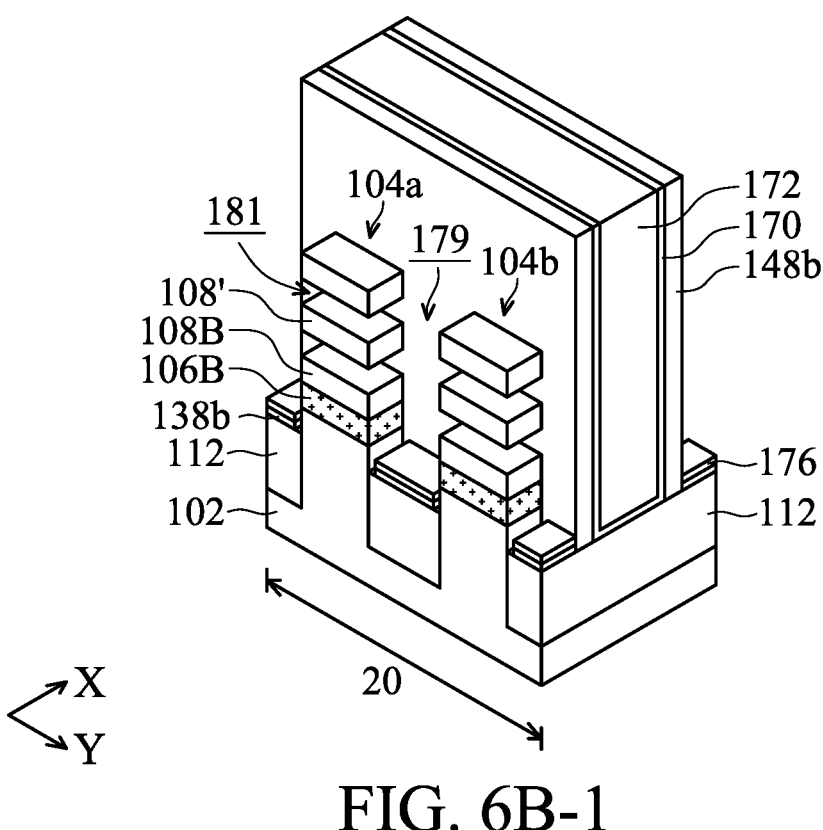
Figures 2, 6B:
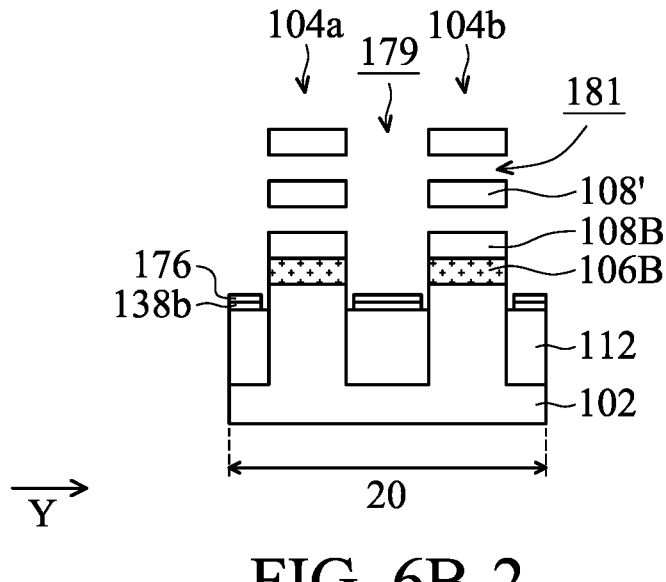
Figures 1, 6C:
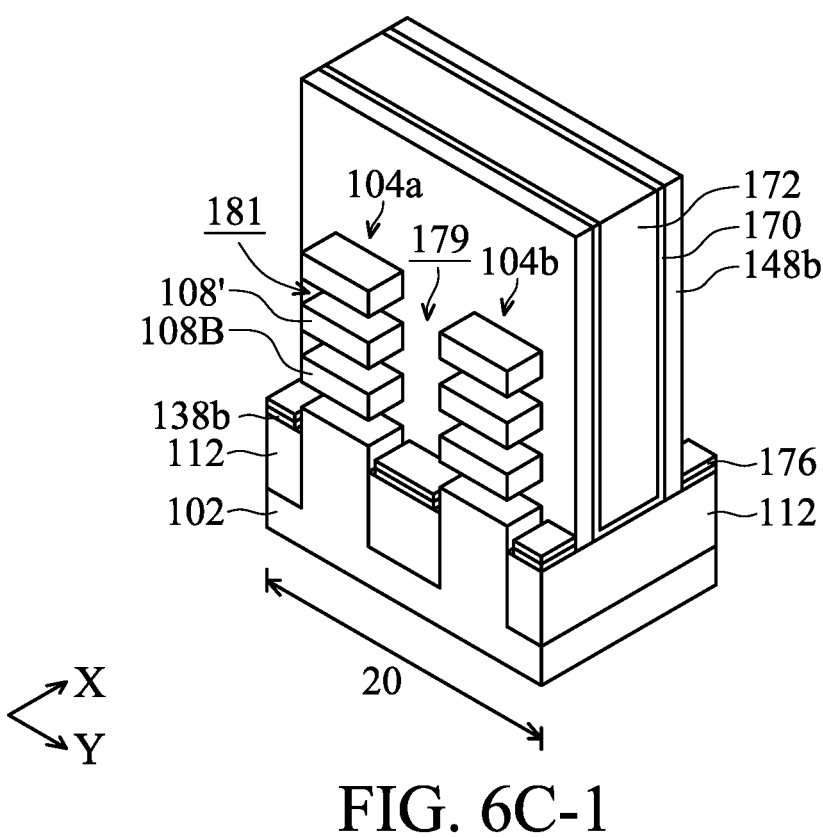
Figures 2, 6C:
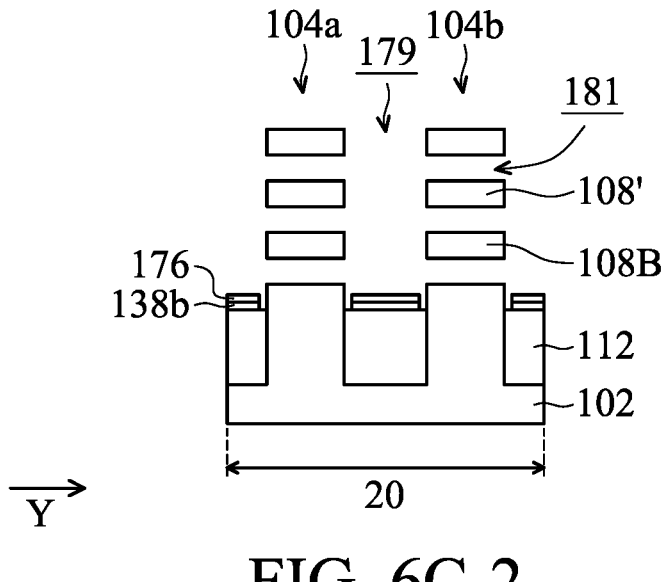
Figures 1, 6D:
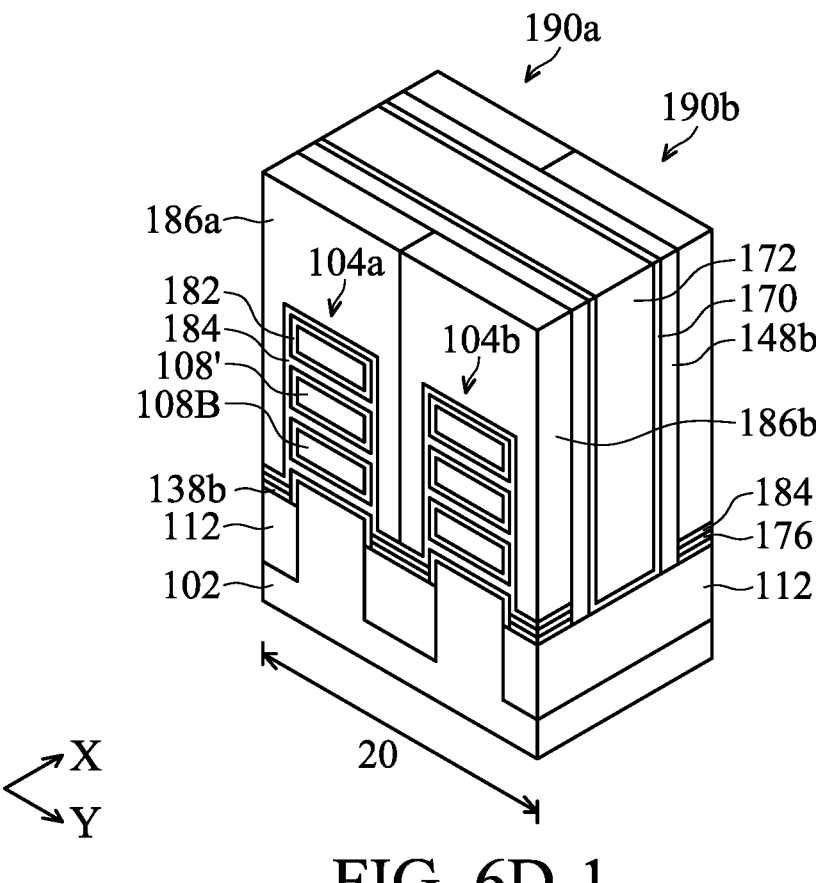
Figures 2, 6D:
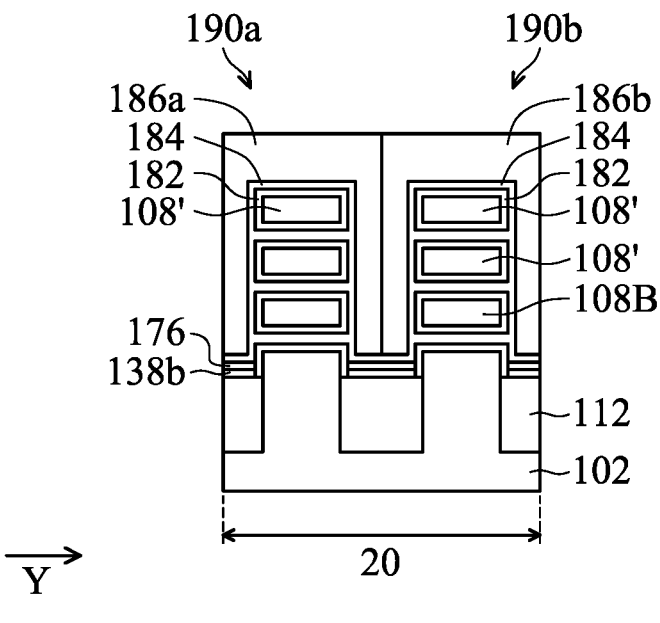

FIGS. 6A-1-6D-1 show perspective views of various stages of forming the semiconductor device structure 100*a* after the structure of FIGS. 4G-1 and 4G-2 in the second region 20, in accordance with some embodiments of the disclosure. FIGS. 6A-2-6D-2 show cross-sectional representations of various stages of forming the semiconductor device structure 100*a* along line Y-Y' shown in FIG. 6A-1, in accordance with some embodiments of the disclosure.

As shown in FIGS. 6A-1 and 6A-2, the exposed portion of the dummy gate dielectric layer 138*b* in the second region 20 is removed, in accordance with some embodiments of the disclosure. The portion of the dummy gate dielectric layer 138*b* that is covered by the hard mask layer 176 remains. As a result, the trench 179 is formed.

Afterwards, as shown in FIGS. 6B-1 and 6B-2, the sacrificial layer 152 is removed to form nanostructures 108', in accordance with some embodiments of the disclosure. In addition, the gaps 181 are formed.

Next, as shown in FIGS. 6C-1 and 6C-2, the bottommost first semiconductor layer 106B is removed in the second region 20, in accordance with some embodiments. It should be noted that the number of the suspended nanostructures 108' in the second region 20 is three, but the number of the suspended nanostructures 108' in the first region 10 is two.

Afterwards, as shown in FIGS. 6D-1 and 6D-2, the first gate structure 190*a* is formed in the trench 179 and the gaps 181, and the second gate structure 190*b* is formed in the trench 179 and the gaps 181, in accordance with some embodiments. As a result, the number of nanostructures 108' (e.g. the second semiconductor layers 108') are surrounded by the first gate structure 190*a*. The portion of the second semiconductor layers 108' in the second region 20 covered by the first gate structure 190*a* can be referred to as a channel region.

Figure 7:
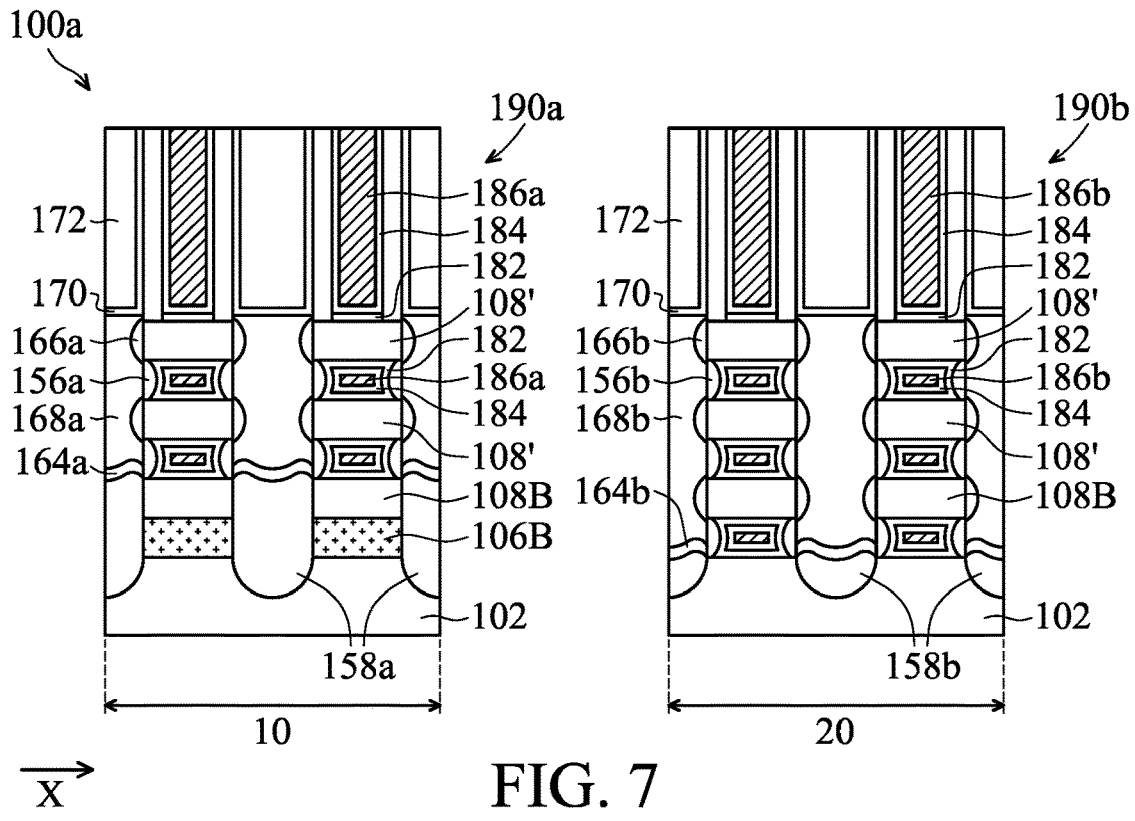
FIG. 7 shows a cross-sectional representation of the semiconductor device structure, in accordance with some embodiments of the disclosure.

FIG. 7 shows a cross-sectional representation of the semiconductor device structure 100*a*, in accordance with some embodiments of the disclosure. FIG. 7 show a cross-sectional representations of the semiconductor device structure 100*a* along line X-X' shown in FIG. 1F, in accordance with some embodiments of the disclosure.

As shown in FIG. 7, in the first region 10, the bottommost first semiconductor layer 106B is below the nanostructures 108', and in the second region 20, there is no bottommost first semiconductor layer. The first dummy layer 158a is in direct contact with the bottommost first semiconductor layer 106B in the first region 10. The bottommost first semiconductor layer 106B is below and in direct contact with the bottommost second semiconductor layer 108B. The first dummy layer 158a is also in direct contact with the bottommost second semiconductor layer 108B, and therefore the bottommost second semiconductor layer 108B become dummy nanostructure. The bottommost surface of the second gate structure 190b is lower than the bottommost surface of the first gate structure 190a.

In the first region 10, the first dummy layer 158a is formed over the substrate 102, and the first insulating layer 164a is formed over the first dummy layer 158a. The location of the first insulating layer 164a determinates the function of the nanostructure (e.g. the nanostructures 108' in the first region 10) workable or not. The bottommost second semiconductor layer 108B in the first region 10 is below the top surface of the first insulating layer 164a. Furthermore, the first insulating layer 164a is in direct contact with one of the nanostructures 108' (e.g. the bottommost second semiconductor layer 108B in the first region 10). Therefore, the bottommost one of nanostructures (e.g. bottommost second semiconductor layer 108B) cannot perform the function of a channel of the semiconductor device structure 100a. Therefore, the effective nanostructure number of semiconductor device structure 100a in the first region 10 is two.

In the second region 20, the second dummy layer 158b is formed over the substrate 102, and the second insulating layer 164b is formed over the second dummy layer 158b. The bottommost second semiconductor layer 108B in the second region 20 is above the top surface of the second insulating layer 164b and is used to as nanostructures 108'. Therefore, the effective nanostructure number of semiconductor device structure 100a in the second region 10 is three.

The effective nanostructure number of semiconductor device structure 100a in the second region 20 is three, and the effective nanostructure number of semiconductor device structure 100a in the first region 10 is two since the location of the first dummy layer 158a and the location of the first insulating layer 164a. The location of the first dummy layer 158a is determined by the location of the bottommost first semiconductor layer 106B.

More nanostructures (e.g. three nanostructure 108' in the second region 20) can provide large effective width ($W_{eff}$) of the channel. The large effective width ($W_{eff}$) of channel can provide high speed of the semiconductor device structure. However, the larger effective width of the channel consumes more power. For high speed performance consideration, larger effective width ($W_{eff}$) is formed by having more nanostructures. For power efficiency consideration, smaller effective width ($W_{eff}$) is formed by having fewer nanostructures. In order to fulfill different needs in a region, the effective nanostructure number can be controlled by forming the bottommost first semiconductor layer 106B and further defining the locations of the first dummy layer 158a, the second dummy layer 158b, the first insulating layer 164a and the second insulating layer 164b.

The effective nanostructure number of semiconductor device structure 100a in the second region 20 is greater than the effective nanostructure number of the semiconductor device structure 100a in the first region 10. Therefore, the semiconductor device structure 100a in the first region 10 is formed for power efficiency and the semiconductor device structure 100a in the second region 20 is formed for high speed performance.

It should be noted that the effective width ($W_{eff}$) of the channel may be controlled by adjusting the width of nanostructure along the X-direction or the Y-direction. If the semiconductor device structure with large effective width ($W_{eff}$) of the channel is designed along the X-direction or the Y-direction, it may occupy too much area. If the semiconductor device structure 100a with small effective width ($W_{eff}$) of the channel is designed along the X-direction or the Y-direction, the process window for filling the gate structure or forming the S/D structure may be decreased. In this disclosure, the effective width ($W_{eff}$) of the channel is controlled by defining the effective numbers of the nanostructures along the Z-direction, rather than in the X-direction or the Y-direction, to reduce the cell area and improve the process window.

Figure 8:
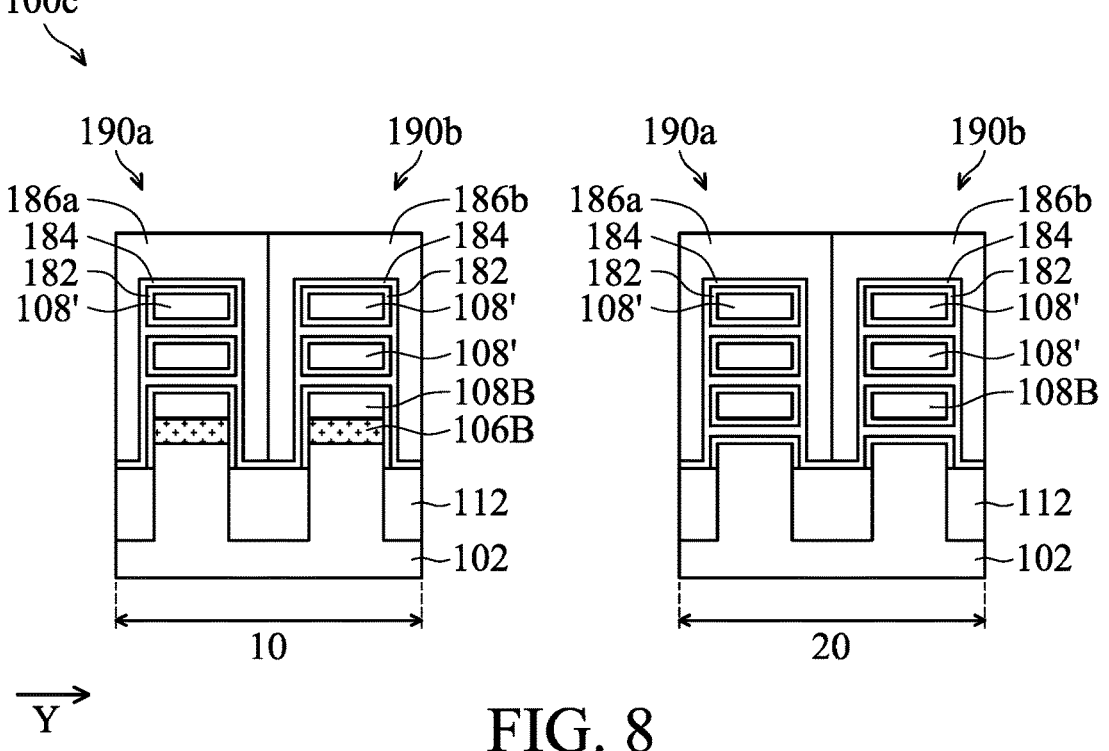
FIG. 8 shows a cross-sectional representation of a semiconductor device structure, in accordance with some embodiments of the disclosure.

FIG. 8 shows a cross-sectional representation of a semiconductor device structure 100c, in accordance with some embodiments of the disclosure. FIG. 8 show a cross-sectional representations of the semiconductor device structure 100c along line Y-Y' shown in FIG. 4A-1, in accordance with some embodiments of the disclosure.

The semiconductor device structure 100c of FIG. 8 includes elements that are similar to, or the same as, elements of the semiconductor device structure 100c of FIG. 8, the difference between the FIG. 8 and FIG. 7 is the no hard mask layer 176 and no dummy gate dielectric layer 138 is above the isolation structure 112.

Figure 9A:
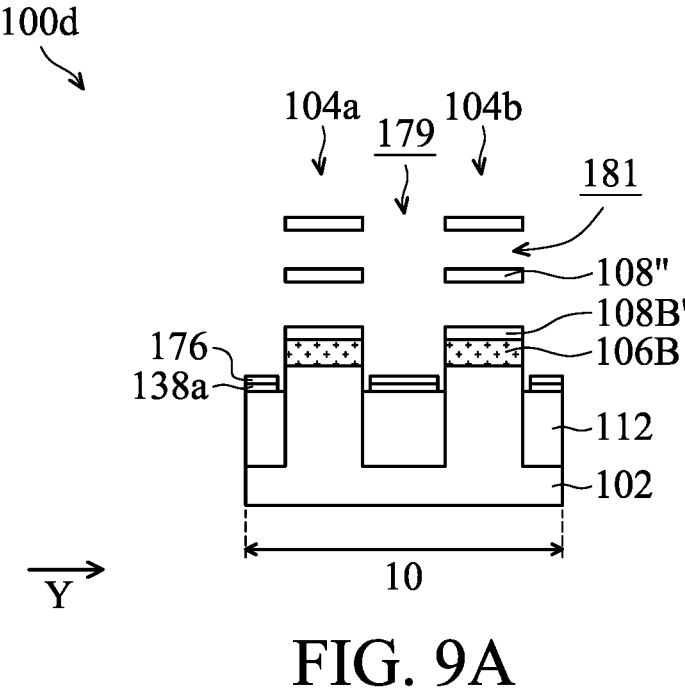
FIGS. 9A-9B show cross-sectional representations of various stages of forming a semiconductor device structure in the first region, in accordance with some embodiments of the disclosure.
Figure 9B:
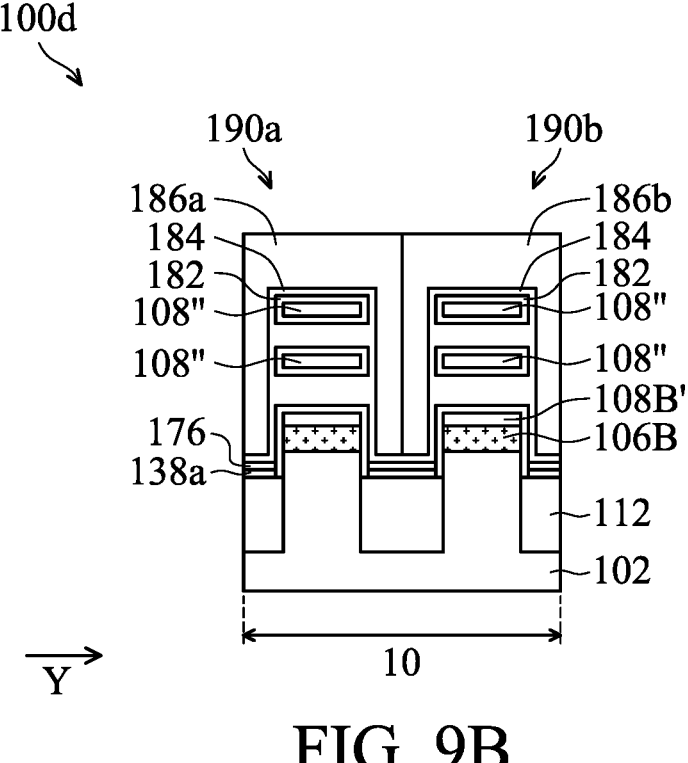

FIGS. 9A-9B show cross-sectional representations of various stages of forming a semiconductor device structure 100d in the first region 10, in accordance with some embodiments of the disclosure.

The semiconductor device structure 100d of FIG. 9A is similar to, or the same as, the semiconductor device structure 100a of FIG. 5C-2, the difference between the FIG. 9A and FIG. 5C-2 is that, the nanostructures 108' is further thinned to form thinned nanostructures 108". The bottommost first second semiconductor layer 108B is also thinned to form the thinned bottommost first second semiconductor layer 108B'.

Next, as shown in FIG. 9B, the number of thinned nanostructures 108" are surrounded by the first gate structure 190a and the second gate structure 190b.

In some embodiments, the first gate structure 190a is a n-type field effect transistors (NFETs) and the second gate structure 190b a p-type FET field effect transistors (PFETs). In some other embodiments, the first gate structure 190a is a p-type FET field effect transistors (PFETs), and the second gate structure 190b is a n-type field effect transistors (NFETs). The effective nanostructure number of semiconductor device structure 100d in the first region 10 is two since the location of the bottommost first semiconductor layer 106B.

Figure 10A:
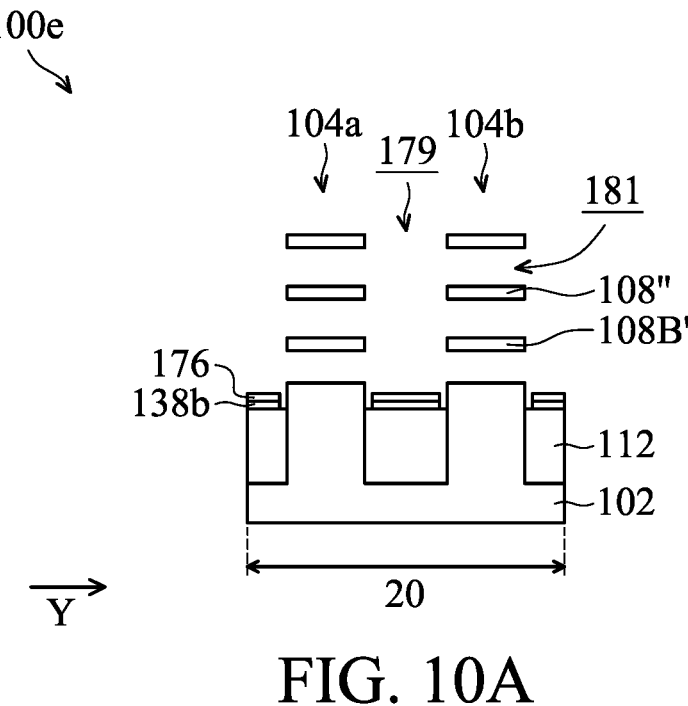
FIGS. 10A-10B show cross-sectional representations of various stages of forming a semiconductor device structure in the second region, in accordance with some embodiments of the disclosure.
Figure 10B:
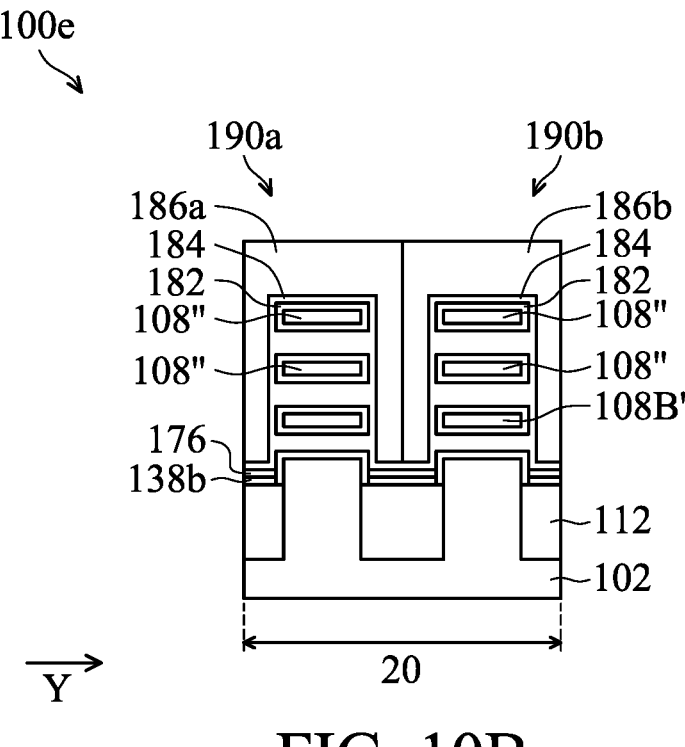

FIGS. 10A-10B show cross-sectional representations of various stages of forming a semiconductor device structure 100e in the second region 20, in accordance with some embodiments of the disclosure.

The semiconductor device structure 100e of FIG. 10A is similar to, or the same as, the semiconductor device structure 100a of FIG. 6C-2, the difference between the FIG. 10A and FIG. 6C-2 is that, the nanostructures 108' is further thinned to form thinned nanostructures 108". Note that there is no bottommost first semiconductor layer 106B in the second region 20.

Next, as shown in FIG. 10B, the number of thinned nanostructures 108" are surrounded by the first gate structure 190a and the second gate structure 190b. In some embodiments, the first gate structure 190a is a n-type field effect transistors (NFETs) and the second gate structure 190*b* a p-type FET field effect transistors (PFETs). In some other embodiments, the first gate structure 190*a* is a p-type FET field effect transistors (PFETs), and the second gate structure 190*b* is a n-type field effect transistors (NFETs). The effective nanostructure number of semiconductor device structure 100*e* in the second region 20 is three.

Figure 11A:
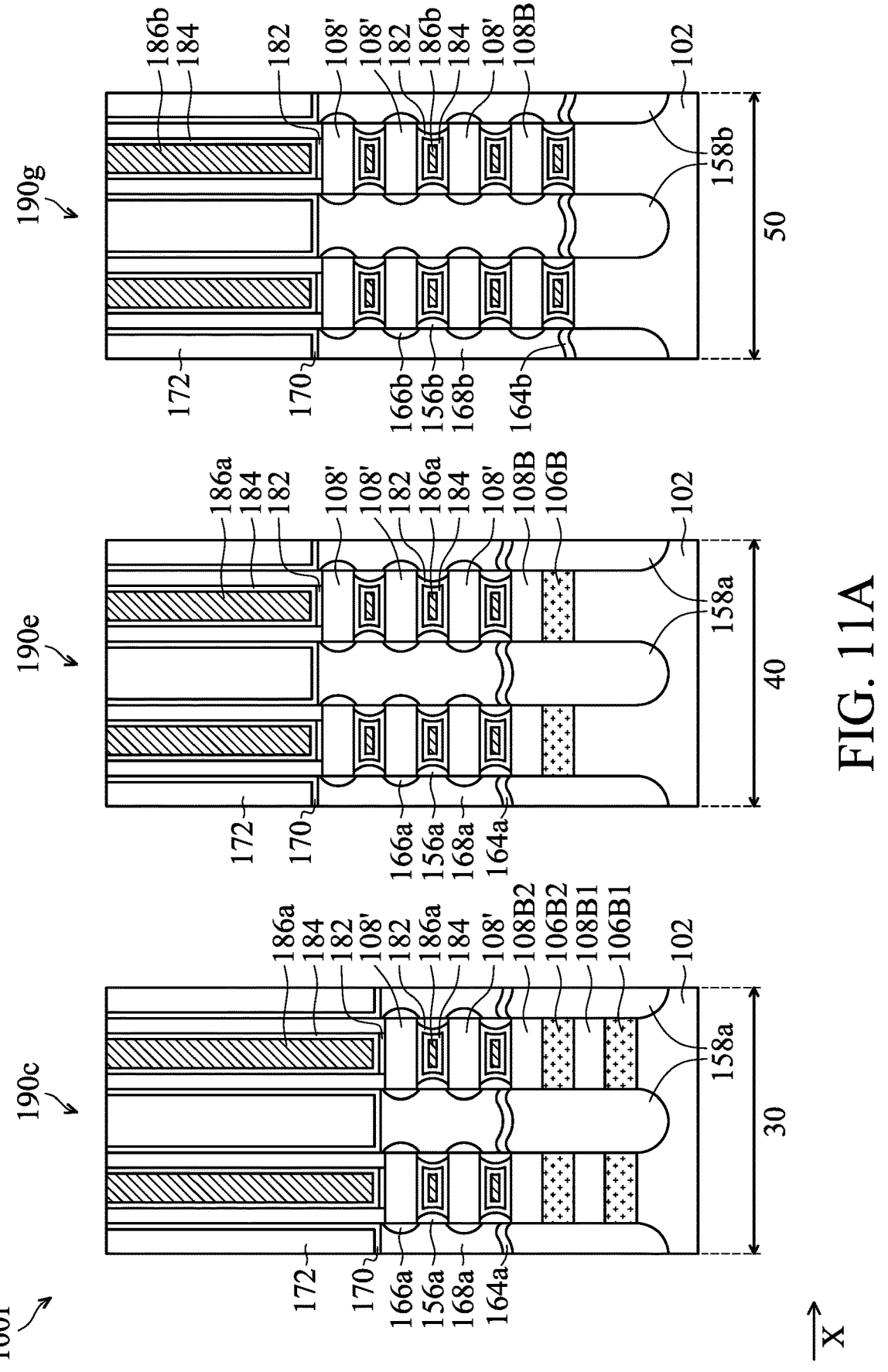
FIG. 11A shows a cross-sectional representation of a semiconductor device structure along line X-X' shown in FIG. 1E, in accordance with some embodiments of the disclosure.

FIG. 11A shows a cross-sectional representation of a semiconductor device structure 100*f* along line X-X' shown in FIG. 1E, in accordance with some embodiments of the disclosure.

As shown in FIG. 11A, the substrate 102 includes a third region 30, a fourth region 40 and a fifth region 50. In the third region 30, there are two first semiconductor layers 106B1, 106B2 below the third gate structure 190*c*. There are two second semiconductor layers 108B1, 108B2 below the third gate structure 190*c*. The first semiconductor layers 106B1, 106B2, and the second semiconductor layers 108B1, 108B2 are in direct contact with the first dummy layer 158*a*. The effective nanostructure number of semiconductor device structure 100*f* in the third region 30 is two. In the fourth region 40, there is one first semiconductor layers 106B1 below the fifth gate structure 190*e*. The effective nanostructure number of semiconductor device structure 100*f* in the fourth region 40 is three.

In the fifth region 50, there is no bottommost first semiconductor layer below the seventh gate structure 190*g*, and the effective nanostructure number of the semiconductor device structure 100*f* in the fifth region 50 is fourth. The number of the second semiconductor layers 106 determinates the effective nanostructure number of the semiconductor device structure 100*f*.

Figure 11B:
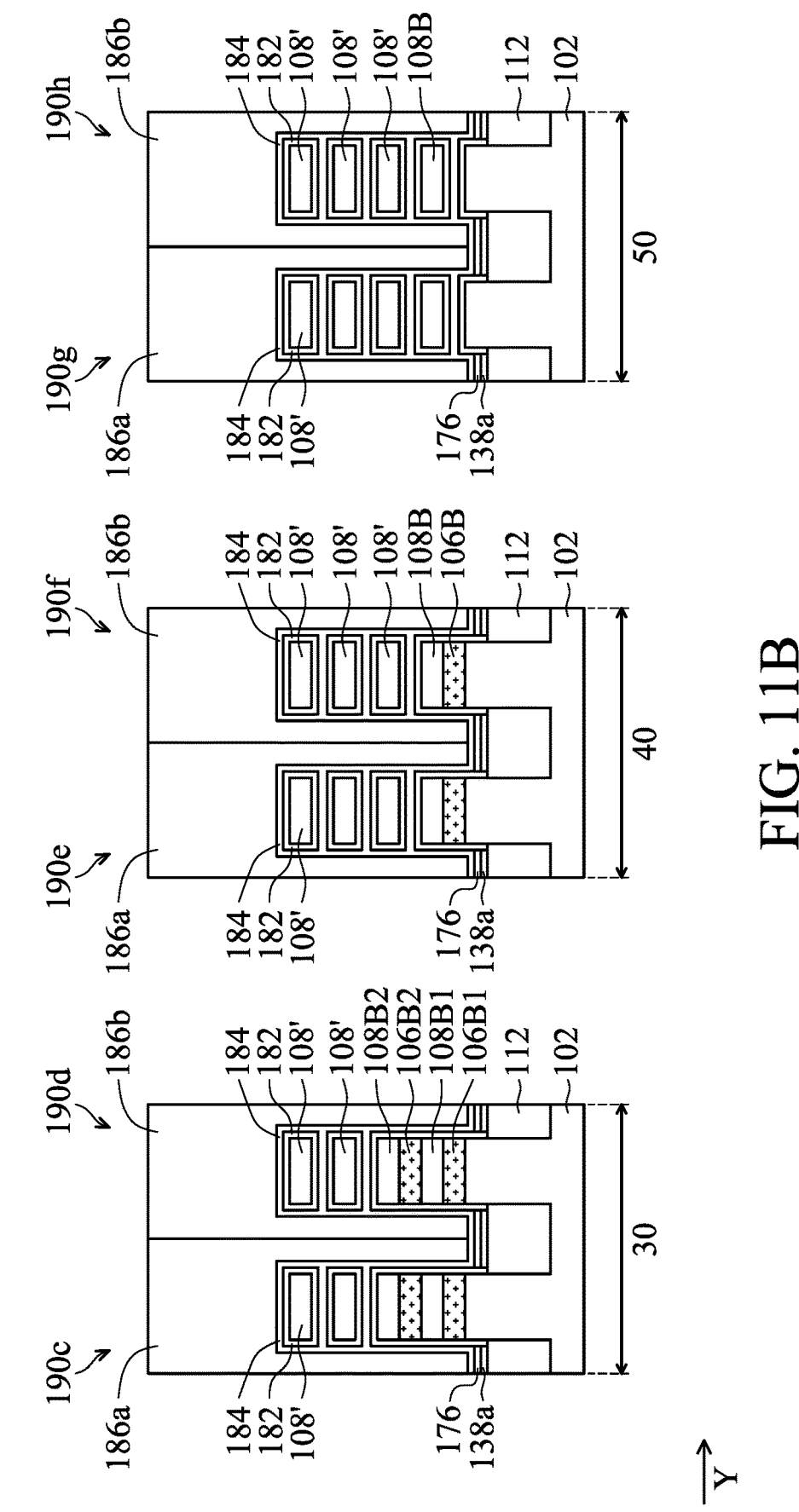
FIG. 11B shows a cross-sectional representation of a semiconductor device structure along line Y-Y' shown in FIG. 4A-1, in accordance with some embodiments of the disclosure.

FIG. 11B shows a cross-sectional representation of a semiconductor device structure 100*f* along line Y-Y' shown in FIG. 4A-1, in accordance with some embodiments of the disclosure.

As shown in FIG. 11B, in the third region 30, there are two first semiconductor layers 106B1, 106B2, and two second semiconductor layers 108B1, 108B2 below the third gate structure 190*c* and the fourth gate structure 190*d*. There are two active nanostructures 108' above the first semiconductor layers 106B1, 106B2 in the third region 30.

In the fourth region 40, there is one first semiconductor layers 106B below the fifth gate structure 190*e* and the sixth gate structure 190*f*. There are three active nanostructures 108' above the first semiconductor layer 106B1 in the fourth region 40.

In the fifth region 50, there is no bottommost first semiconductor layer below the seventh gate structure 190*g* and the eighth gate structure 190*h*, and there are fourth active nanostructures 108' in the fifth region 50.

Figure 12:
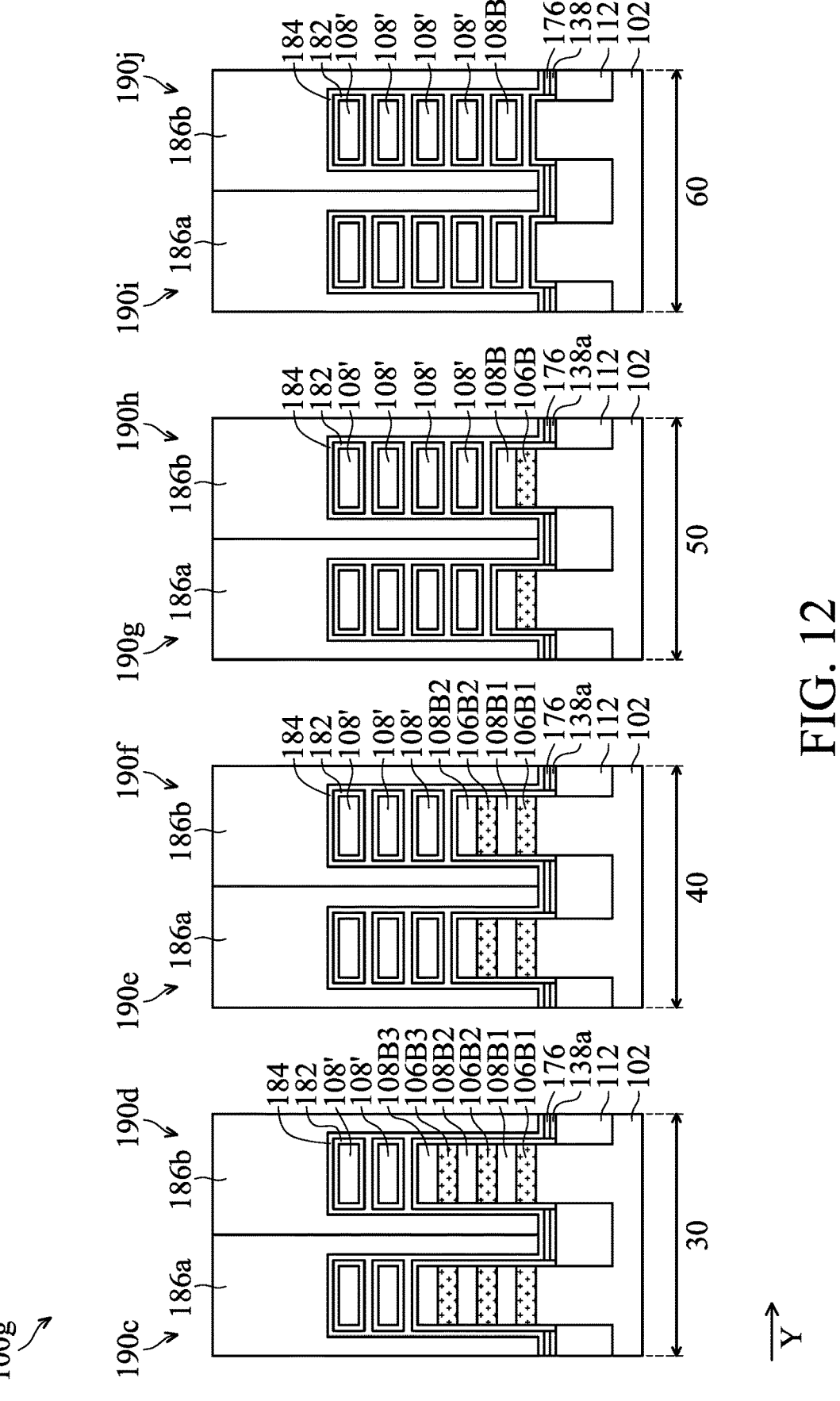
FIG. 12 shows a cross-sectional representation of a semiconductor device structure along line Y-Y' shown in FIG. 4A-1, in accordance with some embodiments of the disclosure.

FIG. 12 shows a cross-sectional representation of a semiconductor device structure 100*g* along line Y-Y' shown in FIG. 4A-1, in accordance with some embodiments of the disclosure.

As shown in FIG. 12, the substrate 102 includes the third region 30, the fourth region 40, the fifth region 50 and the sixth region 60. In the third region 30, there are three first semiconductor layers 106B1, 106B2 and 106B3 below the third gate structure 190*c*. There are two active nanostructures 108' above the first semiconductor layers 106B1, 106B2 and 106B3 in the third region 30.

In the fourth region 40, there are two first semiconductor layers 106B1 and 106B2 below the fifth gate structure 190*e* and sixth gate structure 190*f*. There are three active nanostructures 108' above the first semiconductor layers 106B1 and 106B2 in the fourth region 40.

In the fifth region 50, there is one first semiconductor layer 106B1 below the seventh gate structure 190*g* and the eighth gate structure 190*h*, there are fourth active nanostructures 108' in the fifth region 50.

In the sixth region 60, there is no bottommost first semiconductor layer below the ninth gate structure 190*i* and tenth gate structure 190*j*, and there are fifth active nanostructures 108' in the sixth region 60.

The multi-nanostructures are provided by this disclosure. As mentioned above, the location of the first dummy layer 158*a* determinates the function of the nanostructure 108' workable or not.The bottommost nanostructure 108' in the second region 20 is below the bottommost nanostructure 108' in the first region 10. Furthermore, the first insulating layer 164*a* is higher than the bottommost second semiconductor layer 108B. Therefore, the bottommost second semiconductor layer 108B in the first region 10 cannot perform the function of a channel of the semiconductor device structure 100*a*. Therefore, the effective nanostructure number of semiconductor device structure 100*a* in the first region 20 is two.

As mentioned above, the first dummy layer 158*a*, the second dummy layer 158*b*, the first insulating layer 164*a*, and the second insulating layer 164*b* are used to define the effective (or active) nanostructure number (e.g. nanosheet number) and to achieve multi-nanostructures (e.g. nanosheets) co-exist.

In the first region 10, the first dummy layer 158*a* and the first insulating layer 164*a* provide isolation functions, and therefore the first S/D structure with sub-portions 166*a*, 168*a* is isolated from the first dummy layer 158*a* by the first insulating layer 164*a*. In the second region 20, the second dummy layer 158*b* and the second insulating layer 164*b* provide isolation functions, and therefore the second S/D structure with sub-portions 166*b*, 168*b* is isolated from the second dummy layer 158*b* by the second insulating layer 164*b*.

In the first region 10, the effective (or active) nanostructure number is two due to the first dummy layer 158*a* higher than the bottommost second semiconductor 108B. In the second region 20, there are three nanostructures 108' in the second region 20, and the effective (or active) nanostructure number is three.

Embodiments for forming a semiconductor device structure and method for formation the same are provided. The substrate has a first region and a second region. The bottommost first semiconductor layer is formed over the substrate, and a number of first nanostructures are formed over the first bottommost semiconductor layer in the first region. A number of second nanostructures are formed in the second region.A first dummy layer adjacent to the first nanostructures, and a first insulating layer formed over the first dummy layer. A second insulating layer formed over the second dummy layer.

The effective (or active) nanostructure number of the first nanostructures in the first region is smaller than the effective (or active) nanostructure number of the second nanostructures in the second region due to the location of the bottommost first semiconductor layer, and the locations of the first dummy layer and the first insulating layer. The multi-nanostructures co-exist by controlling the location of the first insulating layer. More effective (or active) nanostructures can improve the speed of the semiconductor device structure, and fewer effective (or active) nanostructures can increase the power efficiency. Therefore, the semiconductor device structure can include more effective (or active) nanostructures in a region for speed performance consideration and fewer effective (or active) nanostructures in another region for power efficiency consideration. Therefore, the performance of semiconductor device structure is improved.

In some embodiments, a semiconductor device structure is provided. The semiconductor device structure includes a first bottommost semiconductor layer formed over a substrate, and a plurality of first nanostructures formed over the first bottommost semiconductor layer, and the first nanostructure comprises a plurality of second semiconductor layers. The semiconductor device structure includes a first dummy layer formed adjacent to the first nanostructures, and a first source/drain (S/D) structure formed over the first dummy layer, wherein the first dummy layer is in direct contact with the first bottommost semiconductor layer.

In some embodiments, a semiconductor device structure is provided. The semiconductor device structure includes a substrate having a first region and a second region, and a plurality of first nanostructures stacked in a vertical direction in the first region. The semiconductor device structure includes a plurality of second nanostructures stacked in the vertical direction in the second region, and a silicon germanium (SiGe) layer formed below the first nanostructures in the first region. The semiconductor device structure also includes a first gate structure surrounding the first nanostructures in the first region, and a second gate structure surrounding the second nanostructures in the second region. The bottommost surface of the second gate structure is lower than the bottommost surface of the first gate structure.

In some embodiments, a method for forming a semiconductor device structure is provided. The method includes forming a first stack structure over a substrate, and the first stack structure comprises a plurality of first semiconductor layers and a plurality of second semiconductor layers stacked in a vertical direction. The method also includes forming a dummy gate structure over the first stack structure, and removing a portion of the first stack structure to form a first S/D trench. The method also includes removing a portion of the first semiconductor layers to form recesses, and the bottommost first semiconductor layer remains. The method includes forming a sacrificial layer in the recesses, and removing a portion of the sacrificial layer to form notches. The method includes forming an inner spacer in the notches, and forming a first dummy layer in the first S/D trench, and the first dummy layer is in direct contact with the bottommost first semiconductor layer. The method includes forming a first source/drain (S/D) structure over the first dummy layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a first bottommost semiconductor layer formed over a substrate;

a plurality of first nanostructures formed over the first bottommost semiconductor layer, wherein the first nanostructure comprises a plurality of second semiconductor layers;
a first dummy layer formed adjacent to the first nanostructures; and
a first source/drain (S/D) structure formed over the first dummy layer, wherein a top surface of the first dummy layer is lower than a bottom surface of the first S/D structure.

2. The semiconductor device structure as claimed in claim 1, wherein the first bottommost semiconductor layer is in direct contact with a bottommost second semiconductor layer.

3. The semiconductor device structure as claimed in claim 1, further comprising:
a first insulating layer formed over the first dummy layer, wherein the first insulating layer is between the first dummy layer and the first S/D structure.

4. The semiconductor device structure as claimed in claim 3, further comprising:
a first gate structure surrounding the first nanostructures; and
an inner spacer between the first gate structure and the first S/D structure, wherein the inner spacer is in direct contact with the first insulating layer.

5. The semiconductor device structure as claimed in claim 3, wherein the first insulating layer has a curved top surface.

6. The semiconductor device structure as claimed in claim 1, further comprising:
a plurality of second nanostructures adjacent to the first nanostructures; and
a second dummy layer formed adjacent to the second nanostructures, wherein a top surface of the first dummy layer is higher than a top surface of the second dummy layer.

7. The semiconductor device structure as claimed in claim 6, further comprising:
a second S/D structure formed over the second dummy layer, wherein a bottom surface of the second S/D structure is lower than a bottom surface of the first S/D structure.

8. The semiconductor device structure as claimed in claim 1, further comprising:
an isolation structure formed over the substrate; and
a hard mask layer formed adjacent to the first nanostructures, wherein the hard mask layer is over the isolation structure.

9. The semiconductor device structure as claimed in claim 1, further comprising:
another first semiconductor layer formed above the first bottommost semiconductor layer, wherein another first semiconductor layer is in direct contact with the first dummy layer.

10. A semiconductor device structure, comprising:
a substrate having a first region and a second region;
a plurality of first nanostructures stacked in a vertical direction in the first region;
a plurality of second nanostructures stacked in the vertical direction in the second region;
a silicon germanium (SiGe) layer formed below the first nanostructures in the first region;
a first gate structure surrounding the first nanostructures in the first region; and
a second gate structure surrounding the second nanostructures in the second region, wherein a bottommost surface of the second gate structure is lower than a bottommost surface of the first gate structure.

11. The semiconductor device structure as claimed in claim 10, further comprising:

a first dummy layer formed adjacent to the first nanostructures in the first region; and a second dummy layer formed adjacent to the second nanostructures in the second region, wherein a first height of the first dummy layer is greater than a second height of the second dummy layer.

12. The semiconductor device structure as claimed in claim 11, further comprising:

a first insulating layer formed over the first dummy layer; and a second insulating layer formed over the second dummy layer, wherein a top surface of the first insulating layer is higher than a top surface of the second insulating layer.

13. The semiconductor device structure as claimed in claim 12, further comprising:

a first S/D structure formed over the first insulating layer; and a first inner spacer between the first S/D structure and the first gate structure, wherein the first inner spacer is in direct contact with the first insulating layer.

14. The semiconductor device structure as claimed in claim 13, further comprising:

a second S/D structure formed over the second insulating layer; and a second inner spacer between the second S/D structure and the second gate structure, wherein a bottommost surface of the second inner spacer is lower than a bottommost surface of the first inner spacer.

15. The semiconductor device structure as claimed in claim 10, further comprising:

an isolation structure formed over the substrate; and a hard mask layer formed adjacent to the first nanostructures, wherein the hard mask layer is over the isolation structure.

16. A method for forming a semiconductor device structure, comprising:

forming a first stack structure over a substrate, wherein the first stack structure comprises a plurality of first semiconductor layers and a plurality of second semiconductor layers stacked in a vertical direction;

forming a dummy gate structure over the first stack structure;

removing a portion of the first stack structure to form a first S/D trench;

removing a portion of the first semiconductor layers to form recesses, wherein a bottommost first semiconductor layer remains;

forming a sacrificial layer in the recesses;

removing a portion of the sacrificial layer to form notches;

forming an inner spacer in the notches;

forming a first dummy layer in the first S/D trench, wherein the first dummy layer is in direct contact with the bottommost first semiconductor layer; and forming a first source/drain (S/D) structure over the first dummy layer.

17. The method for forming the semiconductor device structure as claimed in claim 16, further comprising:

forming a first insulating layer over the first dummy layer, wherein the first insulating layer is in direct contact with the inner spacer; and forming the first S/D structure over the first insulating layer.

18. The method for forming the semiconductor device structure as claimed in claim 16, further comprising:

removing the sacrificial layer to form nanostructures; and forming a gate structure surrounding the nanostructures.

19. The method for forming the semiconductor device structure as claimed in claim 16, further comprising:

forming an isolation structure over the substrate; and forming a hard mask layer over the isolation structure.

20. The method for forming the semiconductor device structure as claimed in claim 16, further comprising:

forming a second stack structure over a substrate, wherein the second stack structure comprises a plurality of first semiconductor layers and a plurality of second semiconductor layers stacked in the vertical direction;

forming a dummy gate structure over the second stack structure;

removing a portion of the second stack structure to form a second S/D trench; and forming a second dummy layer in the second S/D trench, wherein a top surface of the first dummy layer is higher than a top surface of the second dummy layer.

* * * * *